United States Patent
Li

(10) Patent No.: US 11,342,037 B2
(45) Date of Patent: May 24, 2022

(54) SHIFT REGISTER UNIT, DRIVING METHOD, LIGHT EMITTING CONTROL GATE DRIVING CIRCUIT, AND DISPLAY APPARATUS

(71) Applicant: BOE TECHNOLOGY GROUP CO., LTD., Beijing (CN)

(72) Inventor: Quanhu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 230 days.

(21) Appl. No.: 16/609,723

(22) PCT Filed: Mar. 5, 2019

(86) PCT No.: PCT/CN2019/076920
§ 371 (c)(1),
(2) Date: Oct. 30, 2019

(87) PCT Pub. No.: WO2020/007059
PCT Pub. Date: Jan. 9, 2020

(65) Prior Publication Data
US 2021/0335255 A1    Oct. 28, 2021

(30) Foreign Application Priority Data
Jul. 5, 2018  (CN) .......................... 201810730307.5

(51) Int. Cl.
*G09G 3/3266*  (2016.01)
*G11C 19/28*  (2006.01)
*G09G 3/36*  (2006.01)

(52) U.S. Cl.
CPC .......... *G11C 19/28* (2013.01); *G09G 3/3266* (2013.01); *G09G 3/3674* (2013.01); *G09G 2310/0286* (2013.01)

(58) Field of Classification Search
CPC .. G09G 3/3258; G09G 3/3266; G09G 3/3674; G09G 2300/0823;
(Continued)

(56) References Cited

U.S. PATENT DOCUMENTS 8,422,621 B2   4/2013 Jang et al.
8,867,697 B2   10/2014 Jang et al.
(Continued)

FOREIGN PATENT DOCUMENTS

| CN | 102750898 A | 10/2012 |
|----|-------------|---------|
| CN | 103226927 A | 7/2013  |

(Continued)

*Primary Examiner* — Michael J Eurice
(74) *Attorney, Agent, or Firm* — Kinney & Lange, P.A.

(57) ABSTRACT

The present disclosure provides a shift register unit, a driving method, a light emitting control gate driving circuit, and a display apparatus. The shift register unit includes: a light emitting control signal output terminal, a pull-up control node control circuit, N stages of inversion control circuits, a pull-up node control circuit, a pull-down node control circuit, and an output circuit, where N is an integer greater than 1. A first stage of inversion control circuit is configured to invert an input signal. An $n^{th}$ stage of inversion control circuit inverts the input signal under control of an $(n-1)^{th}$ inversion node, where n is an integer and $2 \leq n \leq N$.

18 Claims, 14 Drawing Sheets

(58) Field of Classification Search
CPC ... G09G 2300/0842; G09G 2310/0286; G09G 2310/08; G11C 19/00; G11C 19/28; G11C 27/04

See application file for complete search history.

(56) References Cited

U.S. PATENT DOCUMENTS

| | | | |
|---|---|---|---|
| 10,027,329 B2 | 7/2018 | Wu | |
| 10,049,762 B2 | 8/2018 | Shang | |
| 2004/0239608 A1 | 12/2004 | Chung | |
| 2005/0151715 A1* | 7/2005 | Chegal | G11C 19/00 345/100 |
| 2007/0052653 A1* | 3/2007 | Shin | G09G 3/3266 345/98 |
| 2008/0101529 A1* | 5/2008 | Tobita | G11C 19/28 377/64 |
| 2009/0010379 A1* | 1/2009 | Chiang | G11C 19/28 377/64 |
| 2010/0134399 A1* | 6/2010 | Ki | G11C 19/28 345/94 |
| 2011/0116592 A1* | 5/2011 | Tsai | G11C 19/184 377/79 |
| 2011/0148853 A1* | 6/2011 | Ko | G11C 19/28 345/213 |
| 2012/0162187 A1* | 6/2012 | Lee | G09G 3/29 345/212 |
| 2012/0269316 A1* | 10/2012 | Jang | G11C 19/00 377/75 |
| 2012/0293401 A1* | 11/2012 | Li | G11C 19/184 345/100 |
| 2013/0038587 A1* | 2/2013 | Song | G09G 3/20 345/211 |
| 2013/0077736 A1* | 3/2013 | Son | G09G 3/2085 377/69 |
| 2013/0136224 A1* | 5/2013 | Qing | H03K 3/0375 377/64 |
| 2013/0181747 A1* | 7/2013 | Yoon | G11C 19/28 327/108 |
| 2013/0243150 A1 | 9/2013 | Jang et al. | |
| 2014/0376682 A1* | 12/2014 | Jang | G11C 19/28 377/64 |
| 2016/0358573 A1* | 12/2016 | Takeuchi | G09G 3/3677 |
| 2017/0047128 A1 | 2/2017 | Dai | |
| 2017/0141777 A1 | 5/2017 | Wu | |
| 2017/0256218 A1* | 9/2017 | Dai | G11C 19/28 |
| 2018/0226008 A1 | 8/2018 | Zhou | |
| 2019/0130856 A1* | 5/2019 | Chen | G09G 3/20 |

FOREIGN PATENT DOCUMENTS

| | | |
|---|---|---|
| CN | 104751816 A | 7/2015 |
| CN | 104883181 A | 9/2015 |
| CN | 105161134 A | 12/2015 |
| CN | 105336291 A | 2/2016 |
| CN | 105489153 A | 4/2016 |
| CN | 108806583 A | 11/2018 |

\* cited by examiner

SHIFT REGISTER UNIT, DRIVING METHOD, LIGHT EMITTING CONTROL GATE DRIVING CIRCUIT, AND DISPLAY APPARATUS

CROSS-REFERENCE TO RELATED APPLICATION(S)

This application is the national phase of PCT Application No. PCT/CN2019/076920 filed on Mar. 5, 2019, which in turn claims priority to the Chinese Patent Application No. 201810730307.5, filed on Jul. 5, 2018, which is incorporated herein by reference in its entirety.

TECHNICAL FIELD

The present disclosure relates to the field of display technologies, and more particularly, to a shift register unit, a driving method, a light emitting control gate driving circuit, and a display apparatus.

BACKGROUND

In an Organic Light Emitting Diode (OLED) display apparatus (for example, an Active Matrix-OLED (AMO-LED) display apparatus), control is performed through light emitting control signals to provide data signals to driving transistors to generate driving current for driving OLED light emitting units. The light emitting control signals may be generated by light emitting control gate driving circuits, wherein each of the light emitting control gate driving circuits comprises cascaded shift register units, and the respective shift register units are used to control light emitting control signals for different rows of pixels respectively.

SUMMARY

The embodiments of the present disclosure provide a shift register unit comprising a pull-up control node control circuit, N stages of inversion control circuits, a pull-up node control circuit, a pull-down node control circuit, and an output circuit, where N is an integer greater than 1, wherein a first stage of inversion control circuit in the N stages of inversion control circuits is electrically connected to an input terminal and a first inversion node, and is configured to invert an input signal from the input terminal to generate a first inversion signal and output the first inversion signal to the first inversion node under control of the input signal;

an $n^{th}$ stage of inversion control circuit in the N stages of inversion control circuits is electrically connected to the input terminal, an $(n-1)^{th}$ inversion node, and an $n^{th}$ inversion node, and is configured to invert the input signal to generate an $n^{th}$ inversion signal and output the $n^{th}$ inversion signal to the $n^{th}$ inversion node under control of a potential at the $(n-1)^{th}$ inversion node, where n is an integer and $2 \leq n \leq N$;

the pull-up control node control circuit is electrically connected to the input terminal, a first clock signal input terminal, a first voltage input terminal, an $N^{th}$ inversion node, and a pull-up control node, and is configured to transmit a potential at the $N^{th}$ inversion node to the pull-up control node under control of a first clock signal from the first clock signal input terminal, and transmit a first voltage signal from the first voltage input terminal to the pull-up control node under control of the input signal;

the pull-up node control circuit is electrically connected to the pull-up control node, a second clock signal terminal, a pull-down node, and a pull-up node, and is configured to control a potential at the pull-up node under control of a potential at the pull-up control node, a second clock signal from the second clock signal input terminal and a potential at the pull-down node;

the pull-down node control circuit is electrically connected to the first clock signal input terminal, the second clock signal input terminal, the input terminal, and the pull-down node, and is configured to control the potential at the pull-down node based on the input signal and the second clock signal under control of the first clock signal; and the output circuit is electrically connected to a light emitting control signal output terminal, the pull-up node, the pull-down node, the first voltage input terminal and a second voltage input terminal, and is configured to transmit the first voltage signal or a second voltage signal from the second voltage input terminal to the light emitting control signal output terminal under control of the potentials at the pull-up node and the pull-down node.

In some embodiments, the pull-down node control circuit comprises:

an input control sub-circuit electrically connected to the first clock signal input terminal, the input terminal, and the pull-down node, and configured to transmit the input signal at the input terminal to the pull-down node under control of the first clock signal from the first clock signal input terminal;

a first energy storage sub-circuit electrically connected to the pull-down node and a pull-down storage node, and configured to store a voltage between the pull-down node and the pull-down storage node; and a bootstrap control sub-circuit electrically connected to the second clock signal input terminal, the pull-down node, and the pull-down storage node, and configured to transmit the second clock signal at the second clock signal terminal to the pull-down storage node under control of the potential at the pull-down node.

In some embodiments, the input control sub-circuit comprises: an input control transistor having a gate electrically connected to the first clock signal input terminal, a first electrode electrically connected to the input terminal, and a second electrode electrically connected to the pull-down node.

In some embodiments, the first energy storage sub-circuit comprises: a first capacitor having a first terminal electrically connected to the pull-down node, and a second terminal electrically connected to the pull-down storage node.

In some embodiments, the bootstrap control sub-circuit comprises: a bootstrap control transistor having a gate electrically connected to the pull-down node, a first electrode electrically connected to the second clock signal input terminal, and a second electrode electrically connected to the pull-down storage node.

In some embodiments, the pull-up node control circuit comprises:

a primary pull-up node control sub-circuit electrically connected to the pull-up control node, the pull-up storage node, and the second clock signal input terminal, and configured to transmit the second clock signal from the second clock signal input terminal to the pull-up storage node under control of the pull-up control node;

a second energy storage sub-circuit electrically connected to the pull-up control node and the pull-up storage node, and configured to store a voltage between the pull-up control node and the pull-up storage node; and a secondary pull-up node control sub-circuit electrically connected to the pull-down node, the first voltage input terminal, the pull-up node, the second clock signal input terminal, and the pull-up storage node, and configured to transmit the first voltage signal from the first voltage input terminal to the pull-up node under control of the pull-down node and transmit the potential at the pull-up storage node to the pull-up node under control of the second clock signal.

In some embodiments, the primary pull-up node control sub-circuit comprises: a first pull-up node control transistor having a gate electrically connected to the pull-up control node, a first electrode electrically connected to the second clock signal input terminal, and a second electrode electrically connected to the pull-up storage node.

In some embodiments, the second energy storage sub-circuit comprises: a second capacitor having a first terminal electrically connected to the pull-up control node, and a second terminal electrically connected to the pull-up storage node.

In some embodiments, the secondary pull-up node control sub-circuit comprises:

a second pull-up node control transistor having a gate electrically connected to the second clock signal input terminal, a first electrode electrically connected to the pull-up node, and a second electrode electrically connected to the pull-up storage node, and a third pull-up node control transistor having a gate electrically connected to the pull-down node, a first electrode electrically connected to the first voltage input terminal, and a second electrode electrically connected to the pull-up node.

In some embodiments, the first stage of inversion control circuit comprises:

a first inversion control transistor having a gate electrically connected to the input terminal, a first electrode electrically connected to the first voltage input terminal, and a second electrode electrically connected to the first inversion node; and a second inversion control transistor having a gate electrically connected to the second voltage input terminal, a first electrode electrically connected to the first inversion node, and a second electrode electrically connected to the second voltage input terminal.

In some embodiments, the first stage of inversion control circuit comprises:

a first inversion control transistor having a gate electrically connected to the input terminal, a first electrode electrically connected to the first voltage input terminal, and a second electrode electrically connected to the first inversion node; and a second inversion control transistor having a gate electrically connected to the first clock signal input terminal, a first electrode electrically connected to the first inversion node, and a second electrode electrically connected to the second voltage input terminal.

In some embodiments, the $n^{th}$ stage of inversion control circuit comprises:

a $(2n-1)^{th}$ inversion control transistor having a gate electrically connected to the input terminal, a first electrode electrically connected to the first voltage input terminal, and a second electrode electrically connected to the $n^{th}$ inversion node; and a $(2n)^{th}$ inversion control transistor having a gate electrically connected to the $(n-1)^{th}$ inversion node, a first electrode electrically connected to the $n^{th}$ inversion node, and a second electrode electrically connected to the second voltage input terminal.

In some embodiments, N=2, the first stage of inversion control circuit comprises:

a first inversion control transistor having a gate electrically connected to the input terminal, a first electrode electrically connected to the first voltage input terminal, and a second electrode electrically connected to the first inversion node; and a second inversion control transistor having a gate electrically connected to the second voltage input terminal or the first clock signal input terminal, a first electrode electrically connected to the first inversion node, and a second electrode electrically connected to the second voltage input terminal; and the second stage of inversion control circuit comprises:

a third inversion control transistor having a gate electrically connected to the input terminal, a first electrode electrically connected to the first voltage input terminal, and a second electrode electrically connected to the second inversion node; and a fourth inversion control transistor having a gate electrically connected to the first inversion node, a first electrode electrically connected to the second inversion node, and a second electrode electrically connected to the second voltage input terminal.

In some embodiments, the pull-up control node control circuit comprises:

a first pull-up control node control transistor having a gate electrically connected to the first clock signal input terminal, a first electrode electrically connected to the pull-up control node, and a second electrode electrically connected to the $N^{th}$ inversion node; and a second pull-up control node control transistor having a gate electrically connected to the input terminal, a first electrode electrically connected to the first voltage input terminal, and a second electrode electrically connected to the pull-up control node.

In some embodiments, the output circuit comprises:

a first output transistor having a gate electrically connected to the pull-up node, a first electrode electrically connected to the light emitting control signal output terminal, and a second electrode electrically connected to the first voltage input terminal; and a second output transistor having a gate electrically connected to the pull-down node, a first electrode electrically connected to the second voltage input terminal, and a second electrode electrically connected to the light emitting control signal output terminal.

The embodiments of the present disclosure further provide a method for driving the shift register unit described above, comprising:

inverting, by the first stage of inversion control circuit of the N stages of inversion control circuits, an input signal from the input terminal, wherein the first stage of inversion control circuit inverts the input signal to generate a first inversion signal and outputs the first inversion signal to the first inversion node, and the $n^{th}$ stage of inversion control circuit inverts the input signal to generate an $n^{th}$ inversion signal and outputs the $n^{th}$ inversion signal to the $n^{th}$ inversion node under control of a potential at the $(n-1)^{th}$ inversion node, where n is an integer and $2 \leq n \leq N$, and N is an integer greater than 1;

transmitting, by the pull-up control node control circuit, a potential at the $N^{th}$ inversion node to the pull-up control node under control of a first clock signal from the first clock signal input terminal, and transmitting a first voltage signal from the first voltage input terminal to the pull-up control node under control of the input signal;

controlling, by the pull-up node control circuit, a potential at the pull-up node under control of a potential at the pull-up control node, a second clock signal from the second clock signal input terminal, and a potential at the pull-down node;

controlling, by the pull-down node control circuit, the potential at the pull-down node based on the input signal and the second clock signal under control of the first clock signal; and transmitting, by the outputting circuit, the first voltage signal or a second voltage signal from the second voltage input terminal to the light emitting control signal output terminal under control of the potentials at the pull-up node and the pull-down node.

In some embodiments, in a first period, a first clock signal at a low level, a second clock signal at a high level, and an input signal at a high level are provided, an $N^{th}$ inversion signal at a low level is output by an $N^{th}$ stage of inversion control circuit at an $N^{th}$ inversion node, a potential at the $N^{th}$ inversion node is transmitted by the pull-up control node control circuit to the pull-up control node, the pull-up node is maintained by the pull-up node control circuit to be at a high level, the pull-down node is caused by the pull-down node control circuit to be at a high level, and the light emitting control signal output terminal is maintained by the output circuit to be at a low level;

in a second period, the first clock signal changes from a low level to a high level, the second clock signal changes from a high level to a low level, the $N^{th}$ stage of inversion control circuit maintains the $N^{th}$ inversion node to be at a low level, the pull-up control node control circuit maintains transmission of the potential at the $N^{th}$ inversion node to the pull-up control node, the pull-up node control circuit causes the pull-up node to become a low level, the pull-down node control circuit maintains the pull-down node to be at a low level, and the output circuit transmits a first voltage signal at a high level to the light emitting control signal output terminal;

in a third period, the first clock signal changes from a high level to a low level, the second clock signal changes from a low level to a high level, the input signal changes from a high level to a low level, the $N^{th}$ stage of inversion control circuit outputs the $N^{th}$ inversion signal at a high level at the $N^{th}$ inversion node, the pull-up control node control circuit transmits the potential at the $N^{th}$ inversion node to the pull-up control node, and the pull-down node control circuit controls the potential at the pull-down node, which causes the output circuit to transmit, to the light emitting control signal output terminal, a level between a level of the first voltage signal and a level of the second voltage signal; and in a fourth period, the first clock signal changes from a low level to a high level, the second clock signal changes from a high level to a low level, and the pull-down node control circuit causes the potential at the pull-down node to be lower than the level of the second voltage signal, wherein the potential at the pull-down node causes the output circuit to transmit the second voltage signal to the light emitting control signal output terminal.

The embodiments of the present disclosure further provide a light emitting control gate driving circuit comprising a plurality of cascaded shift register units described above, wherein except for a first stage of shift register unit, an input terminal of each stage of shift register unit is electrically connected to a light emitting control signal output terminal of a previous stage of shift register unit.

The embodiments of the present disclosure further provide a display apparatus, comprising the light emitting control gate driving circuit described above.

BRIEF DESCRIPTION OF THE ACCOMPANYING DRAWINGS

DETAILED DESCRIPTION

The technical solutions according to the embodiments of the present disclosure will be clearly and completely described below with reference to the accompanying drawings in the embodiments of the present disclosure. It is obvious that the embodiments described are only a part of the embodiments of the present disclosure, instead of all the embodiments. All other embodiments obtained by those of ordinary skill in the art on the basis of the embodiments of the present disclosure without any creative work shall fall within the protection scope of the present disclosure.

The transistors used in all the embodiments of the present disclosure may each be a thin film transistor or a field effect transistor or another device having the same characteristics. In the embodiments of the present disclosure, in order to distinguish two electrodes of the transistor except for a gate, one of the electrodes is referred to as a first electrode, and the other of the electrodes is referred to as a second electrode. In an actual operation, the first electrode may be a drain, and the second electrode may be a source; or the first electrode may be a source, and the second electrode may be a drain.

A conventional shift register unit for generating a light emitting control signal has less redundancy for a process of a PMOS transistor, and particularly has a weak tolerance to a negative drift of a threshold voltage of the PMOS transistor. The conventional shift register unit for generating a light emitting control signal is prone to circuit failure when the process fluctuates, and the shift register unit is provided with a large coupling capacitor which is an additional load for a clock trace, thereby resulting in increased power consumption.

Figure 1:
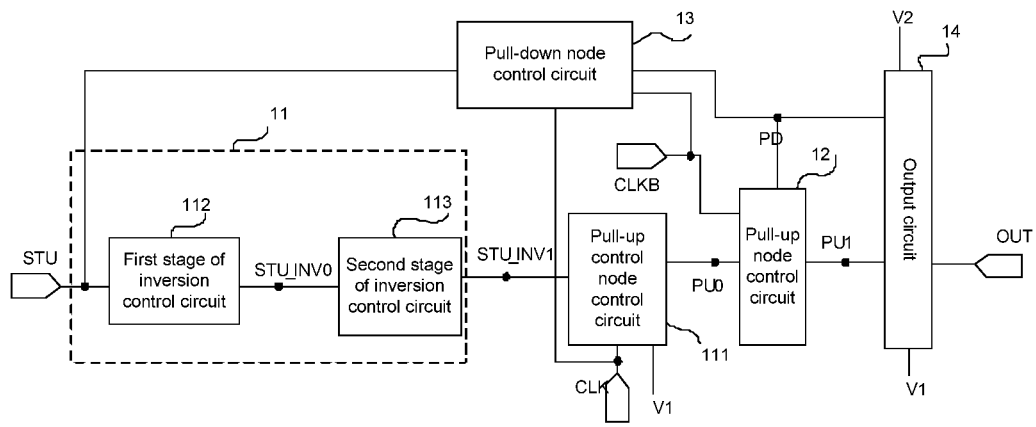
FIG. 1 is a structural diagram of a shift register unit according to an embodiment of the present disclosure.

The embodiments of the present disclosure propose a shift register unit. As shown in FIG. 1, the shift register unit comprises a light emitting control signal output terminal OUT, and the shift register unit further comprises a pull-up control node control circuit 111, N stages of inversion control circuits 11, a pull-up node control circuit 12, a pull-down node control circuit 13, and an output circuit 14, where N is an integer greater than 1.

In FIG. 1, N=2 is taken as an example, but the embodiments of the present disclosure are not limited thereto, and N may be set to other values as needed. As shown in FIG. 1, a first stage of inversion control circuit 112 in the N stages of inversion control circuits is electrically connected to an input terminal STU and a first inversion node STU_INV0, and is configured to invert an input signal from the input terminal STU to generate a first inversion signal and output the first inversion signal to the first inversion node STU_INV0 under control of the input signal.

An $n^{th}$ stage of inversion control circuit (for example, a second stage of inversion control circuit 113 in FIG. 1) in the N stages of inversion control circuits 11 is electrically connected to the input terminal STU, an $(n-1)^{th}$ inversion node (for example, the first inversion node STU_INV0 in FIG. 1), and an $n^{th}$ inversion node (for example, a second inversion node STU_INV1 in FIG. 1), and is configured to invert the input signal to generate an $n^{th}$ inversion signal and output the $n^{th}$ inversion signal to the $n^{th}$ inversion node under control of the input signal and a potential at the $(n-1)^{th}$ inversion node, where n is an integer and $2 \leq n \leq N$.

The pull-up control node control circuit 111 is electrically connected to the input terminal STU, a first clock signal input terminal CLK, a first voltage input terminal (a first voltage input terminal for providing a first voltage signal V1 in FIG. 1), an $N^{th}$ inversion node (the second inversion node STU_INTV1 in FIG. 1), and a pull-up control node PU0, and is configured to transmit a potential at the $N^{th}$ inversion node (the second inversion node STU_INV1 in FIG. 1) to the pull-up control node PU0 under control of a first clock signal from the first clock signal input terminal CLK, and transmit the first voltage signal V1 from the first voltage input terminal to the pull-up control node PU0 under control of the input signal STU.

The pull-up node control circuit 12 is electrically connected to the pull-up control node PU0, a second clock signal terminal CLKB, a pull-down node PD, and a pull-up node PU1, and is configured to control a potential at the pull-up node PU1 under control of a potential at the pull-up control node PU0, a second clock signal from the second clock signal input terminal CLKB and a potential at the pull-down node PD.

The pull-down node control circuit 13 is electrically connected to the first clock signal input terminal CLK, the second clock signal input terminal CLKB, the input terminal STU, and the pull-down node PD, and is configured to control the potential at the pull-down node PD based on the input signal and the second clock signal under control of the first clock signal.

The output circuit 14 is electrically connected to a light emitting control signal output terminal OUT, the pull-up node PU1, the pull-down node PD, the first voltage input terminal for providing the first voltage signal V1 and a second voltage input terminal for providing a second voltage signal V2, and is configured to transmit the first voltage signal or the second voltage signal to the light emitting control signal output terminal OUT under control of the potentials at the pull-up node PU1 and the pull-down node PD.

In the shift register unit according to the embodiment of the present disclosure, at least two stages of inversion control circuits are used, so that except for a first stage of inversion control circuit, each stage of inversion control circuit inverts an input signal under control of an inversion signal output by a previous stage of inversion control circuit, and thereby has a larger output signal voltage range than the first stage of inversion control circuit. Therefore, when process parameters change, an output voltage range of a last stage of inversion control circuit is more close to a full-voltage range (having, for example, a high level value of V2 and a low level value of V1), an output signal of the shift register unit is more stable, and the circuit is less likely to fail. In this way, the shift register unit according to the embodiment of the present disclosure has greater redundancy for a process of a PMOS transistor, particularly has a strong tolerance to a positive drift of a threshold voltage of the PMOS transistor. Further, the shift register unit according to the embodiment of the present disclosure may not use a coupling capacitor, and therefore there is no additional load on a clock trace. It should be understood that although the PMOS transistor is described as an example in the present disclosure, the embodiments of the present disclosure are equally applicable to a case of an NMOS transistor.

In the shift register unit according to the embodiment of the present disclosure, multiple stages of inverters (a number of stages of inversion units included in the multiple stages of inverters is greater than or equal to 2) are used, so that the shift register unit is less affected by parameters of transistors during inversion or switching of an internal signal, and the coupling capacitor is eliminated to improve the stability of the circuit, so that the shift register unit circuit has higher reliability.

The shift register unit according to the present disclosure will be described below by taking N being equal to 2 (but the embodiments of the present disclosure are not limited thereto, and in some embodiments, N may be greater than 2) as an example.

As shown in FIG. 1, the shift register unit according to the embodiment of the present disclosure comprises a light emitting control signal output terminal OUT, and the shift register unit further comprises a pull-up control node control circuit 111, a first stage of inversion control circuit 112, a second stage of inversion control circuit 113, a pull-up node control circuit 12, a pull-down node control circuit 13 and an output circuit 14.

The first stage of inversion control circuit 112 is connected to an input terminal STU and a first inversion node STU_INV0 respectively, and is configured to invert an input signal received at the input terminal STU to obtain a first inversion signal and output the first inversion signal through the first inversion node STU_INV0 under control of the input terminal STU.

The second stage of inversion control circuit 113 is connected to the input terminal STU, the first inversion node STU_INV0 and a second inversion node STU_INV1 respectively, and is configured to invert the input signal to obtain a second inversion signal and output the second inversion signal through the second inversion node STU_INV1 under control of the input terminal STU and the first inversion node STU_INV0.

The pull-up control node control circuit 111 is electrically connected to a first clock signal input terminal CLK, a pull-up control node PU0, the second inversion node STU_INV1, and a first voltage input terminal respectively, and is configured to turn on or turn off a connection between the pull-up control node PU0 and the second inversion node STU_INV1 under control of the first clock signal input terminal CLK and turn on or turn off a connection between the pull-up control node PU0 and the first voltage input terminal under control of the input terminal STU.

The pull-up node control circuit 12 is connected to the pull-up control node PU0, a second clock signal input terminal CLKB, a pull-down node PD, and a pull-up node PU1 respectively, and is configured to control a potential at the pull-up node PU1 under control of the pull-up control node PU0, the second clock signal input terminal CLKB and the pull-down node PD.

The pull-down node control circuit 13 is connected to the first clock signal input terminal CLK, the second clock signal input terminal CLKB, the input terminal STU and the pull-down node PD respectively, and is configured to control a potential at the pull-down node PD under control of the first clock signal input terminal CLK, the second clock signal input terminal CLKB, and the input terminal STU.

The output circuit 14 is electrically connected to the light emitting control signal output terminal OUT, the pull-up node PU1, the pull-down node PD, the first voltage input terminal and a second voltage input terminal.

The first voltage input terminal is configured to input a first voltage V1, and the second voltage input terminal is configured to input a second voltage V2.

When the shift register unit according to the embodiment of the present disclosure shown in FIG. 1 operates, the first stage of inversion control circuit 112 inverts the input signal received at the input terminal STU to obtain a first inversion signal and output the first inversion signal through the first inversion node STU_INV0 under control of the input terminal STU.

The second stage of inversion control circuit 113 inverts the input signal to obtain a second inversion signal and outputs the second inversion signal through the second inversion node STU_INV1 under control of the input signal and the first inversion node STU_INV0.

When the input signal and the first clock signal input at the first clock signal input terminal CLK are both at a first level, the pull-up control node control circuit 111 turns off the connection between the pull-up control node PU0 and the second inversion node STU_INV1, and the pull-up control node control circuit 111 turns off the connection between the pull-up control node PU0 and the first voltage input terminal.

When the input signal is at the first level and the first clock signal is at a second level, the pull-up control node control circuit 111 turns on the connection between the pull-up control node PU0 and the second inversion node STU_INV1, so that the potential at the pull-up control node PU0 is at the second level, and the pull-up control node control circuit 111 turns off the connection between the pull-up control node PU0 and the first voltage input terminal.

When the input signal is at the second level, the pull-up control node control circuit 111 turns on the connection between the pull-up control node PU0 and a high voltage input terminal VGH, so that the potential at the pull-up control node is at the first level.

In some embodiments, if a transistor included in the shift register unit according to the embodiment shown in FIG. 1 is a p-type transistor, the first level may be a high level, and the second level may be a low level. If the transistor included in the shift register unit according to the embodiment shown in FIG. 1 is an n-type transistor, the first level may be a low level and the second level may be a high level.

According to a specific implementation, when the first level is a high level and the second level is a low level, the low level value at the first inversion node STU_INV0 is greater than that at the second inversion node STU_INV1. According to another specific implementation, when the first level is a low level and the second level is a high level, the high level value at the first inversion node STU_INV0 is greater than that at the second inversion node STU_INV1. That is, regardless of whether an n-type transistor or a p-type transistor is used, a signal voltage range at the first inversion node STU_INV0 in the shift register unit according to the embodiment of the present disclosure falls within a signal voltage range at the second inversion node STU_INV1. In some embodiments, a signal of a full-voltage range, for example a signal having a high level of V2 and a low level of V1, may be output at STU_INV1.

In some embodiments, when the input signal is at the first level, the first clock signal is at the second level, and the second clock signal is at the first level, the pull-down node control circuit 13 controls the potential at the pull-down node PD to be at the first level.

When the input signal is at the first level, the first clock signal is at the first level, and the second clock signal is at the second level, the pull-down node control circuit 13 controls the potential at the pull-down node PD to be maintained at the first level.

When the input signal is at the second level, the first clock signal is at the second level, and the second clock signal is at the first level, the pull-down node control circuit 13 controls the potential at the pull-down node PD to be at the second level.

When the input signal is at the second level, the first clock signal is at the first level, and the second clock signal is at the second level, the pull-down node control circuit 13 controls the potential at the pull-down node PD to be at the second level.

Figure 2:
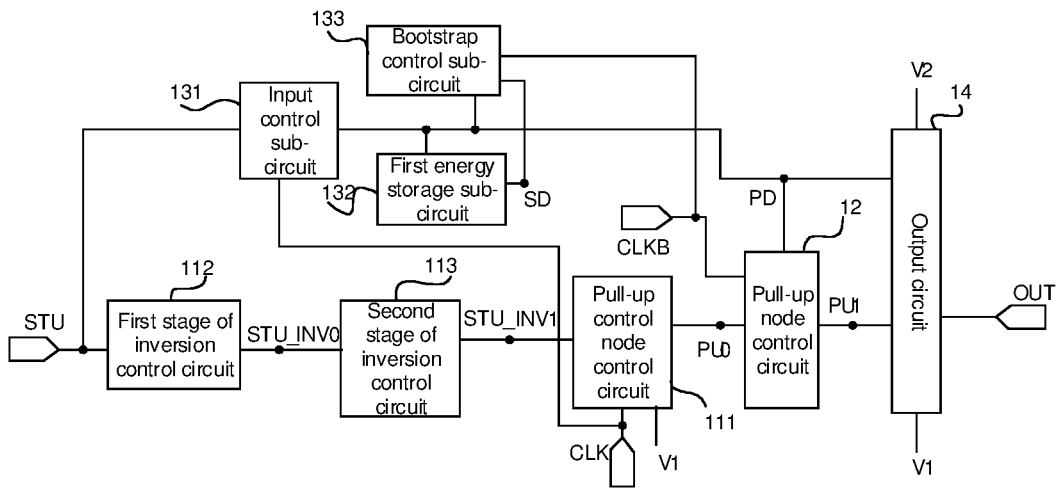
FIG. 2 is a structural diagram of a shift register unit according to another embodiment of the present disclosure.

As shown in FIG. 2, the pull-down node control circuit may comprise an input control sub-circuit 131, a first energy storage sub-circuit 132 and a bootstrap control sub-circuit 133.

In input control sub-circuit 131 is connected to the first clock signal input terminal CLK, the input terminal STU and the pull-down node PD respectively. The input control sub-circuit 131 may transmit the input signal at the input terminal STU to the pull-down node PD under control of the first clock signal from the first clock signal input terminal CLK, for example, may turn on or turn off a connection between the input terminal STU and the pull-down node PD under control of the first clock signal input terminal CLK.

The first energy storage sub-circuit 132 has a first terminal connected to the pull-down node PD, and a second terminal connected to a pull-down storage node SD. The first energy storage sub-circuit 132 may store a voltage between the pull-down node PD and the pull-down storage node SD.

The bootstrap control sub-circuit 133 is connected to the second clock signal input terminal CLKB, the pull-down node PD, and the pull-down storage node SD. The bootstrap control sub-circuit 133 may transmit the second clock signal at the second clock signal terminal CLKB to the pull-down storage node SD under control of the potential at the pull-down node PD, for example, may turn on or turn off a connection between the second clock signal input terminal CLKB and the pull-down storage node SD under control of the pull-down node PD.

When the first level is a high level, the second level is a low level, and the pull-down node control circuit 13 comprises the input control sub-circuit 131, the first energy storage sub-circuit 132, and the bootstrap control sub-circuit 133, the input control sub-circuit 131 turns off the connection between the input terminal STU and the pull-down node PD under control of the first clock signal input terminal CLK.

The bootstrap control sub-circuit 133 turns on the connection between the second clock signal input terminal CLKB and the pull-down storage node SD to pull down the potential at the pull-down node PD through bootstrap under control of the pull-down node PD.

In a case where the transistor included in the shift register unit according to the embodiment of the present disclosure is a p-type transistor, when the potential at the pull-down node PD and the second clock signal input at CLKB are both at a low level, the bootstrap control sub-circuit 133 turns on the connection between the second clock signal input terminal CLKB and the pull-down storage node SD, to pull down the potential at the pull-down node through bootstrap (when the low level signal is valid, the potential at the pull-down node is pulled down through bootstrap via the CLKB).

Figure 3:
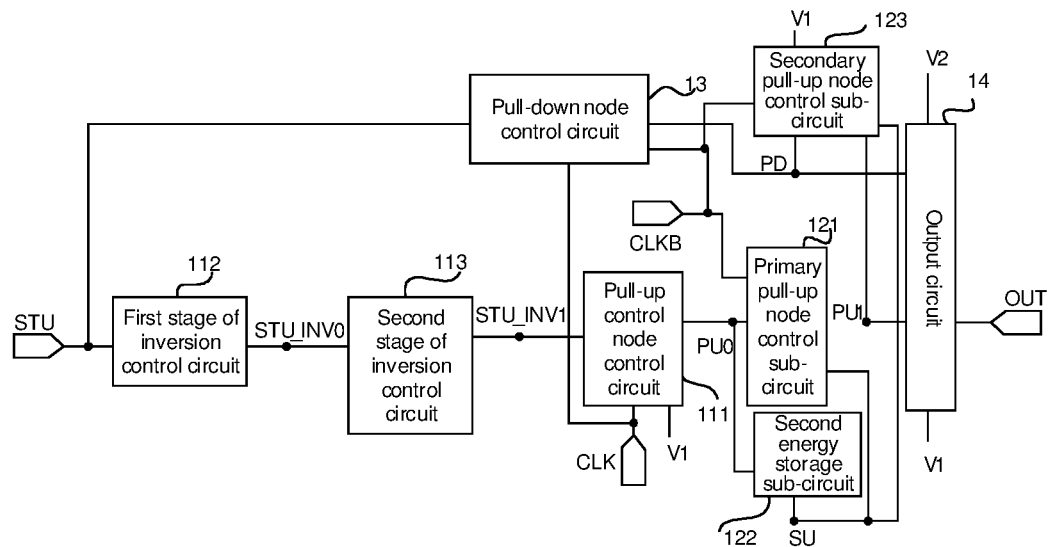
FIG. 3 is a structural diagram of a shift register unit according to a further embodiment of the present disclosure.

As shown in FIG. 3, the pull-up node control circuit may comprise: a primary pull-up node control sub-circuit 121, a second energy storage sub-circuit 122, and a secondary pull-up node control sub-circuit 123.

The primary pull-up node control sub-circuit 121 is connected to the pull-up control node PU0, the pull-up storage node SU, and the second clock signal input terminal CLKB. The primary pull-up node control sub-circuit 121 may transmit the second clock signal from the second clock signal input terminal CLKB to the pull-up storage node SU under control of the pull-up control node PU0, for example, may turn on or turn off a connection between the pull-up storage node SU and the second clock signal input terminal CLKB under control of the pull-up control node PU0.

The second energy storage sub-circuit 122 has a first terminal connected to the pull-up control node PU0, and a second terminal connected to the pull-up storage node SU. The second energy storage sub-circuit 122 may store a voltage between the pull-up control node PU0 and the pull-up storage node SU.

The secondary pull-up node control sub-circuit 123 is connected to the pull-down node PD, the first voltage input terminal, the pull-up node PU1, the second clock signal input terminal CLKB, and the pull-up storage node SU. The secondary pull-up node control sub-circuit 123 may transmit the first voltage signal V1 from the first voltage input terminal to the pull-up node PU1 under control of the pull-down node PD, and may transmit the potential at the pull-up storage node SU to the pull-up node PU1 under control of the second clock signal. For example, the secondary pull-up node control sub-circuit 123 may turn on or turn off a connection between the pull-up node PU1 and the first voltage input terminal under control of the pull-down node PD, and turn on or turn off a connection between the pull-up node PU1 and the pull-up storage node SU under control of the second clock signal input terminal CLKB.

The first voltage input terminal is configured to input the first voltage signal V1.

In some embodiments, the first voltage signal V1 may be a power voltage signal, which may, for example, have a constant high level, but the present disclosure is not limited thereto.

When the pull-up node control circuit 12 according to the present disclosure shown in FIG. 3 operates, the primary pull-up node control sub-circuit 121 is configured to control the potential at the pull-up storage node SU under control of the pull-up control node PU0 and the second clock signal input terminal CLKB, the energy storage sub-circuit 122 is configured to maintain the potential at the pull-up storage node SU, and the secondary pull-up node control sub-circuit 123 is configured to control the potential at the pull-up node PU1 under control of the pull-down node PD, the second clock signal input terminal CLKB and the pull-up storage node SU.

Figure 4A:
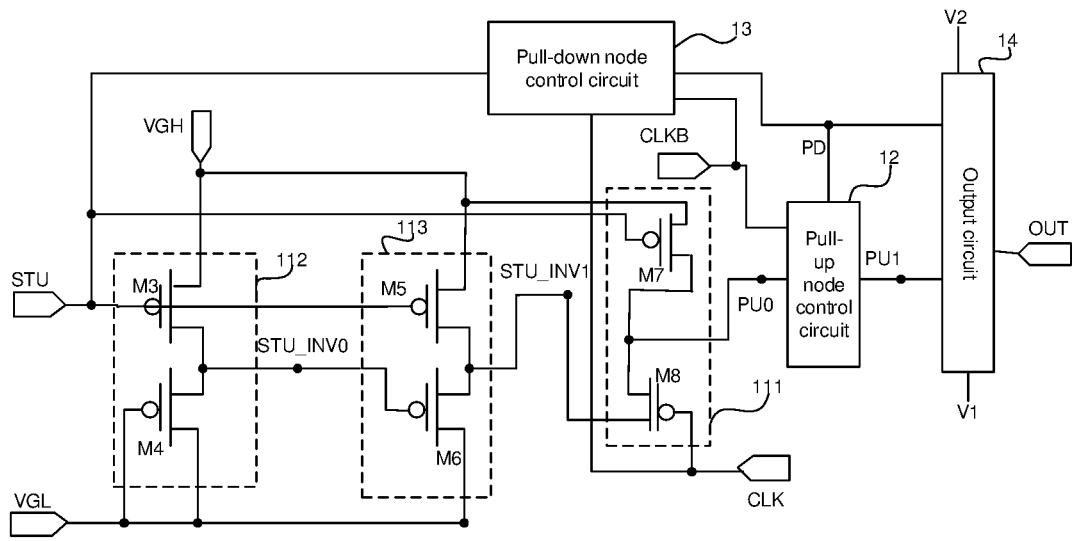
FIG. 4A is a structural diagram of a shift register unit according to yet another embodiment of the present disclosure.

As shown in FIG. 4A, the pull-up control node control circuit 111 may comprise: a first pull-up control node control transistor M8 and a second pull-up control node control transistor M7. The first pull-up control node control transistor M8 has a gate connected to the first clock signal input terminal CLK, a source connected to the pull-up control node PU0, and a drain connected to the second inversion node STU_INTV1. The second pull-up control node control transistor M7 has a gate connected to the input terminal STU, a source electrically connected to a high voltage input terminal VGH (the first voltage signal input terminal), and a drain connected to the pull-up control node PU0. The high voltage input terminal VGH is configured to input a high voltage.

The first stage of inversion control circuit 112 comprises: a first inversion control transistor M3 and a second inversion control transistor M4. The first inversion control transistor M3 has a gate connected to the input terminal STU, a source electrically connected to the high voltage input terminal VGH, and a drain connected to the first inversion node STU_INV0. The second inversion control transistor M4 has a gate electrically connected to a low voltage input terminal VGL (the second voltage signal input terminal), a source connected to the first inversion node STU_INV0, and a drain electrically connected to the low voltage input terminal VGL. The low voltage input terminal VGL is configured to input a low voltage (for example, the second voltage V2).

The second stage of inversion control circuit 113 comprises: a third inversion control transistor M5 and a fourth inversion control transistor M6. The third inversion control transistor M5 has a gate connected to the input terminal STU, a source electrically connected to the high voltage input terminal VGH, and a drain connected to the second inversion node STU_INV1. The fourth inversion control transistor M6 has a gate connected to the first inversion node STU_INV0, a source connected to the second inversion node STU_INV1, and a drain electrically connected to the low voltage input terminal VGL.

In the embodiment shown in FIG. 4A, each transistor is a p-type transistor, but in an actual operation, the above transistors may also be n-type transistors, and a type of the transistors is not limited here.

When the pull-up control node control circuit 111 shown in FIG. 4A operates, inversion of signals is triggered by the input terminal STU, and compared with the conventional technology, M7 and M8 are turned on at the same time for a short time, which may avoid large quiescent current.

Figure 4B:
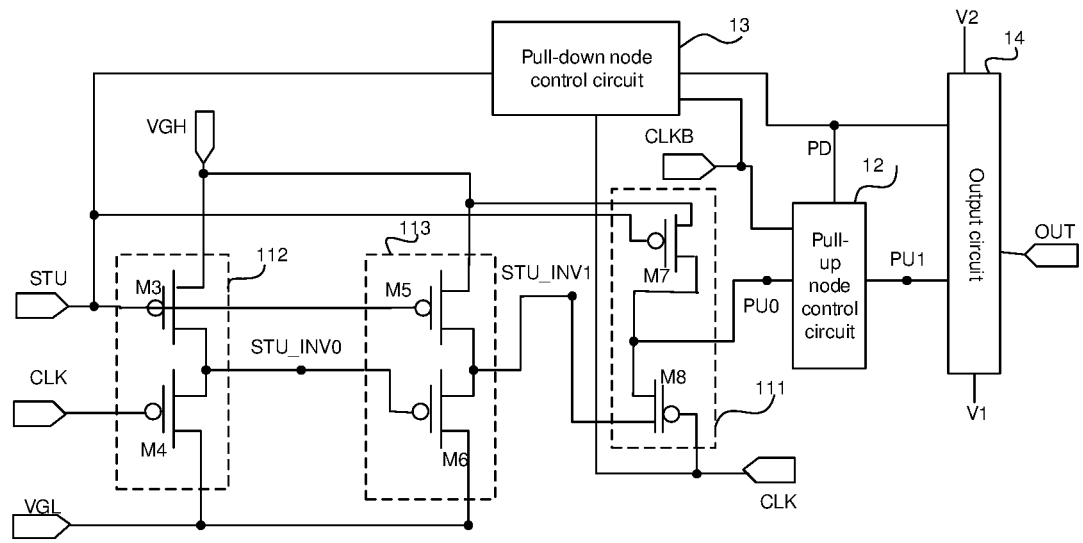
FIG. 4B is a structural diagram of a shift register unit according to still another embodiment of the present disclosure.

As shown in FIG. 4B, the pull-up control node control circuit 111 comprises: a first pull-up control node control transistor M8 and a second pull-up control node control transistor M7. The first pull-up control node control transistor M8 has a gate connected to the first clock signal input terminal CLK, a source connected to the pull-up control node PU0, and a drain connected to the second inversion node STU_INV1. The second pull-up control node control transistor M7 has a gate connected to the input terminal STU, a source electrically connected to the high voltage input terminal VGH, and a drain connected to the pull-up control node PU0. The high voltage input terminal VGH is configured to input a high voltage.

As shown in FIG. 4B, the first stage of inversion control circuit 112 comprises: a first inversion control transistor M3 and a second inversion control transistor M4. The first inversion control transistor M3 has a gate connected to the input terminal STU, a source electrically connected to the high voltage input terminal VGH, and a drain connected to the first inversion node STU_INV0. The second inversion control transistor M4 has a gate connected to the first clock signal input terminal CLK, a source connected to the first inversion node STU_INV0, and a drain electrically connected to the low voltage input terminal VGL. The low voltage input terminal VGL is configured to input a low voltage.

As shown in FIG. 4B, the second stage of inversion control circuit 113 comprises: a third inversion control transistor M5 and a fourth inversion control transistor M6. The third inversion control transistor M5 has a gate connected to the input terminal STU, a source electrically connected to the high voltage input terminal VGH, and a drain connected to the second inversion node STU_INV1. The fourth inversion control transistor M6 has a gate connected to the first inversion node STU_INV0, a source connected to the second inversion node STU_INV1, and a drain electrically connected to the low voltage input terminal VGL.

In the embodiment shown in FIG. 4B, the respective transistors are p-type transistors, but in some embodiments, the above transistors may also be n-type transistors, and a type of the transistors is not limited herein.

The embodiment shown in FIG. 4B differs from the embodiment shown in FIG. 4A in that, in the embodiment shown in FIG. 4B, the gate of the second inversion control transistor M4 is connected to the first clock signal input terminal CLK, while in the embodiment shown in FIG. 4A, the gate of the second inversion control transistor M4 is electrically connected to the low voltage input terminal VGL.

Figure 5A:
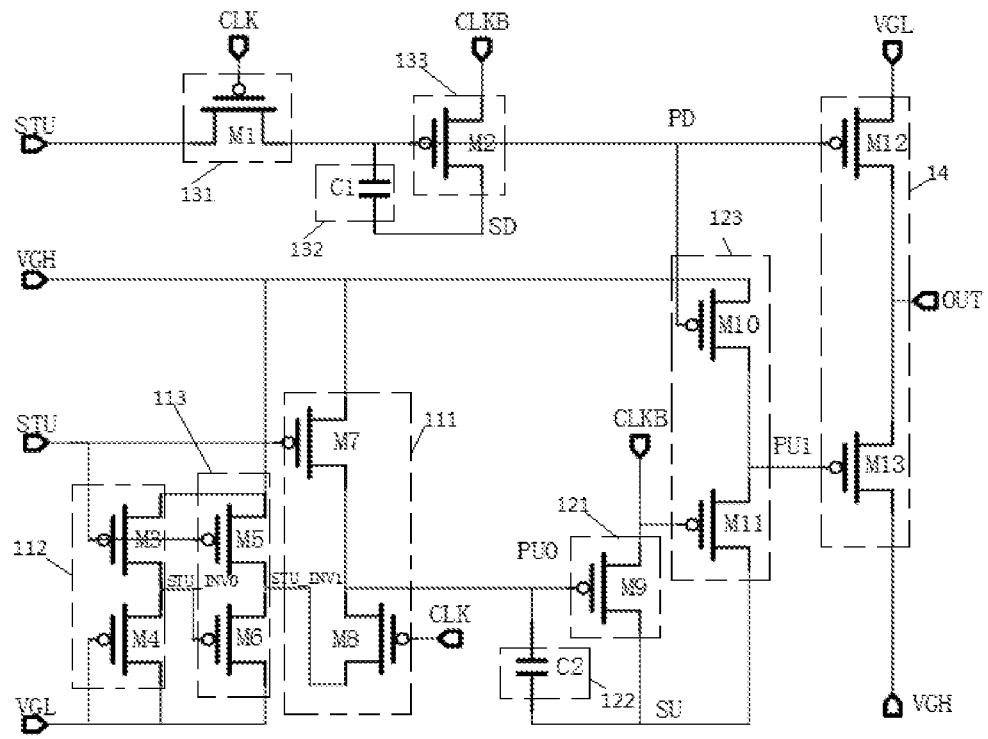
FIG. 5A is an exemplary circuit diagram of a shift register unit according to an embodiment of the present disclosure.

As shown in FIG. 5A, the shift register unit according to the embodiment of the present disclosure comprises a light emitting control signal output terminal OUT, a pull-up control node control circuit 111, a first stage of inversion control circuit 112, a second stage of inversion control circuit 113, a pull-up node control circuit 12, a pull-down node control circuit 13 and an output circuit 14.

The pull-up control node control circuit 111 comprises: a first pull-up control node control transistor M8 and a second pull-up control node control transistor M7. The first pull-up control node control transistor M8 has a gate connected to the first clock signal input terminal CLK, a source connected to the pull-up control node PU0, and a drain connected to the second inversion node STU_INV1. The second pull-up control node control transistor M7 having a gate connected to the input terminal STU, a source electrically connected to the high voltage input terminal VGH, and a drain connected to the pull-up control node PU0. The high voltage input terminal VGH is configured to input a high voltage.

The first stage of inversion control circuit 112 comprises: a first inversion control transistor M3 and a second inversion control transistor M4. The first inversion control transistor M3 having a gate connected to the input terminal STU, a source electrically connected to the high voltage input terminal VGH, and a drain connected to the first inversion node STU_INV0. The second inversion control transistor M4 having a gate electrically connected to the low voltage input terminal VGL, a source connected to the first inversion node STU_INV0, and a drain electrically connected to the low voltage input terminal VGL. The low voltage input terminal VGL is configured to input a low voltage.

The second stage of inversion control circuit 113 comprises: a third inversion control transistor M5 and a fourth inversion control transistor M6. The third inversion control transistor M5 has a gate connected to the input terminal STU, a source electrically connected to the high voltage input terminal VGH, and a drain connected to the second inversion node STU_INV1. The fourth inversion control transistor M6 has a gate connected to the first inversion node STU_INV0, a source connected to the second inversion node STU_INV1, and a drain electrically connected to the low voltage input terminal VGL.

The pull-down node control circuit 13 comprises an input control sub-circuit 131, a first energy storage sub-circuit 132 and a bootstrap control sub-circuit 133.

The input control sub-circuit 131 comprises: an input control transistor M1 having a gate connected to the first clock signal input terminal CLK, a source connected to the input terminal STU, and a drain connected to the pull-down node PD.

The first energy storage sub-circuit 132 comprises: a first capacitor C1 having a first terminal connected to the pull-down node PD, and a second terminal connected to the pull-down storage node SD.

The bootstrap control sub-circuit 133 comprises: a bootstrap control transistor M2 having a gate connected to the pull-down node PD, a source connected to the second clock signal input terminal CLKB, and a drain connected to the pull-down storage node SD.

The pull-up node control circuit 12 comprises a primary pull-up node control sub-circuit 121, a second energy storage sub-circuit 122 and a secondary pull-up node control sub-circuit 123.

The primary pull-up node control sub-circuit 121 comprises: a first pull-up node control transistor M9 having a gate connected to the pull-up control node PU0, a source connected to the second clock signal input terminal CLKB, and a drain connected to the pull-up storage node SU.

The second energy storage sub-circuit 122 comprises: a second capacitor C2 having a first terminal connected to the pull-up control node PU0, and a second terminal connected to the pull-up storage node SU.

The secondary pull-up node control sub-circuit 123 comprises: a second pull-up node control transistor M11 and a third pull-up node control transistor M10. The second pull-up node control transistor M11 has a gate connected to the second clock signal input terminal CLKB, a source connected to the pull-up node PU1, and a drain connected to the pull-up storage node SU. The third pull-up node control transistor M10 has a gate connected to the pull-down node PD, a source electrically connected to the high voltage input terminal VGH, and a drain connected to the pull-up node PU1. The high voltage input terminal VGH is configured to input a high voltage.

The output circuit 14 comprises: a first output transistor M13 and a second output transistor M12. The first output transistor M13 having a gate connected to the pull-up node PU1, a source connected to the light emitting control signal output terminal OUT, and a drain electrically connected to the high voltage input terminal VGH. The second output transistor M12 having a gate connected to the pull-down node PD, a source electrically connected to the low voltage input terminal VGL, and a drain connected to the light emitting control signal output terminal OUT. The low voltage input terminal VGL is configured to input a low voltage.

Figure 5B:
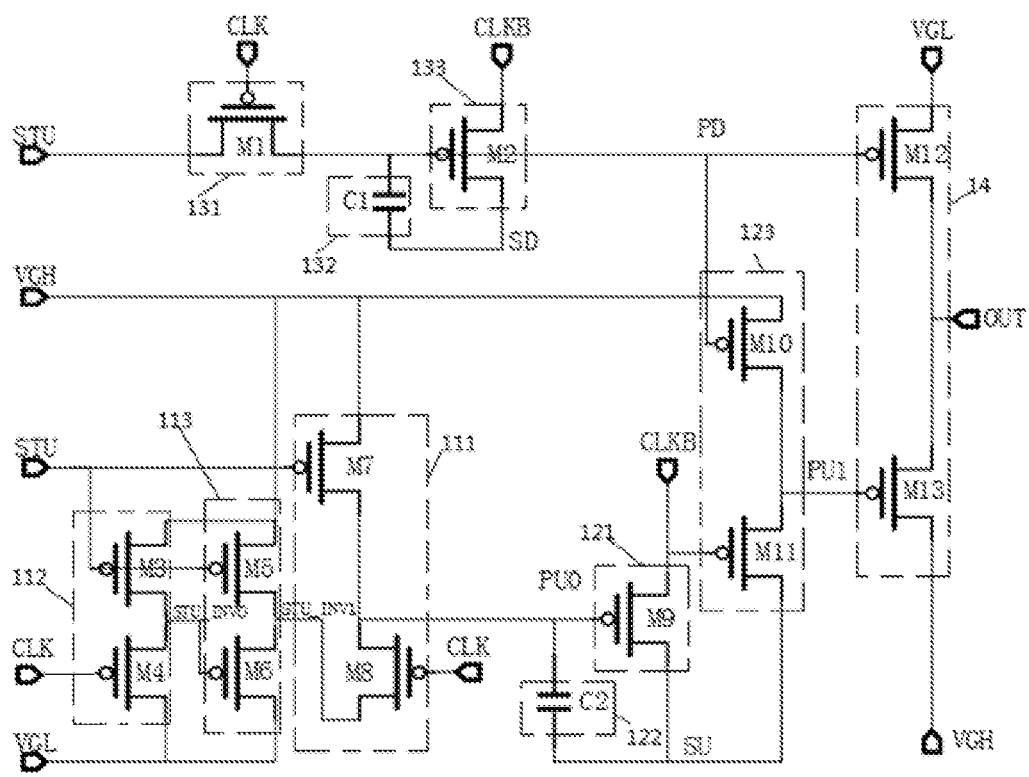
FIG. 5B is another exemplary circuit diagram of a shift register unit according to an embodiment of the present disclosure.

In a specific embodiment of a shift register unit shown in FIG. 5A, all of the transistors are p-type transistors, but in an actual operation, the above transistors may also be replaced with n-type transistors. As shown in FIG. 5B, the shift register unit according to another specific embodiment of the present disclosure comprises a light emitting control signal output terminal OUT, a pull-up control node control circuit 111, a first stage of inversion control circuit 112, a second stage of inversion control circuit 113, a pull-up node control circuit 12, a pull-down node control circuit 13 and an output circuit 14.

The pull-up control node control circuit 111 comprises: a first pull-up control node control transistor M8 and a second pull-up control node control transistor M7. The first pull-up control node control transistor M8 has a gate connected to the first clock signal input terminal CLK, a source connected to the pull-up control node PU0, and a drain connected to the second inversion node STU_INV1. The second pull-up control node control transistor M7 has a gate connected to the input terminal STU, a source electrically connected to the high voltage input terminal VGH, and a drain connected to the pull-up control node PU0, wherein the high voltage input terminal VGH is configured to input a high voltage.

The first stage of inversion control circuit 112 comprises: a first inversion control transistor M3 and a second inversion control transistor M4. The first inversion control transistor M3 having a gate connected to the input terminal STU, a source electrically connected to the high voltage input terminal VGH, and a drain connected to the first inversion node STU_INV0. The second inversion control transistor M4 having a gate connected to the first clock signal input terminal CLK, a source connected to the first inversion node STU_INV0, and a drain electrically connected to the low voltage input terminal VGL, wherein the low voltage input terminal VGL is configured to input a low voltage.

The second stage of inversion control circuit 113 comprises: a third inversion control transistor M5 and a fourth inversion control transistor M6. The third inversion control transistor M5 having a gate connected to the input terminal STU, a source electrically connected to the high voltage input terminal VGH, and a drain connected to the second inversion node STU_INV1. The fourth inversion control transistor M6 having a gate connected to the first inversion node STU_INV0, a source connected to the second inversion node STU_INV1, and a drain electrically connected to the low voltage input terminal VGL.

The pull-down node control circuit 13 comprises an input control sub-circuit 131, a first energy storage sub-circuit 132 and a bootstrap control sub-circuit 133.

The input control sub-circuit 131 comprises: an input control transistor M1 having a gate connected to the first clock signal input terminal CLK, a source connected to the input terminal STU, and a drain connected to the pull-down node PD.

The first energy storage sub-circuit 132 comprises: a first capacitor C1 having a first terminal connected to the pull-down node PD, and a second terminal connected to the pull-down storage node SD.

The bootstrap control sub-circuit 133 comprises: a bootstrap control transistor M2 having a gate connected to the pull-down node PD, a source connected to the second clock signal input terminal CLKB, and a drain connected to the pull-down storage node SD.

The pull-up node control circuit 12 comprises a primary pull-up node control sub-circuit 121, a second energy storage sub-circuit 122 and a secondary pull-up node control sub-circuit 123.

The primary pull-up node control sub-circuit 121 comprises: a first pull-up node control transistor M9 having a gate connected to the pull-up control node PU0, a source connected to the second clock signal input terminal CLKB, and a drain connected to the pull-up storage node SU.

The second energy storage sub-circuit 122 comprises: a second capacitor C2 having a first terminal connected to the pull-up control node PU0, and a second terminal connected to the pull-up storage node SU.

The secondary pull-up node control sub-circuit 123 comprises: a second pull-up node control transistor M11 and a third pull-up node control transistor M10. The second pull-up node control transistor **M1*l* has a gate connected to the second clock signal input terminal CLKB, a source connected to the pull-up node PU1, and a drain connected to the pull-up storage node SU. The third pull-up node control transistor M10** has a gate connected to the pull-down node PD, a source electrically connected to the high voltage input terminal VGH, and a drain connected to the pull-up node PU1. The high voltage input terminal VGH is configured to input a high voltage.

The output circuit 14 comprises: a first output transistor M13 and a second output transistor M12. The first output transistor M13 has a gate connected to the pull-up node PU1, a source connected to the light emitting control signal output terminal OUT, and a drain electrically connected to the high voltage input terminal VGH. The second output transistor M12 has a gate connected to the pull-down node PD, a source electrically connected to the low voltage input terminal VGL, and a drain connected to the light emitting control signal output terminal OUT.

The low voltage input terminal VGL is configured to input a low voltage.

In the specific embodiment of the shift register unit shown in FIG. 5B, all of the transistors are p-type transistors, but in an actual operation, the above transistors may also be replaced with n-type transistors.

The shift register unit shown in FIG. 5B differs from the shift register unit shown in FIG. 5A in that, in the shift register unit shown in FIG. 5B, the gate of the second inversion control transistor M4 is connected to the first clock signal input terminal CLK, while in the shift register unit shown in FIG. 5A, the gate of the second inversion control transistor M4 is electrically connected to the low voltage input terminal VGL.

Figure 6:
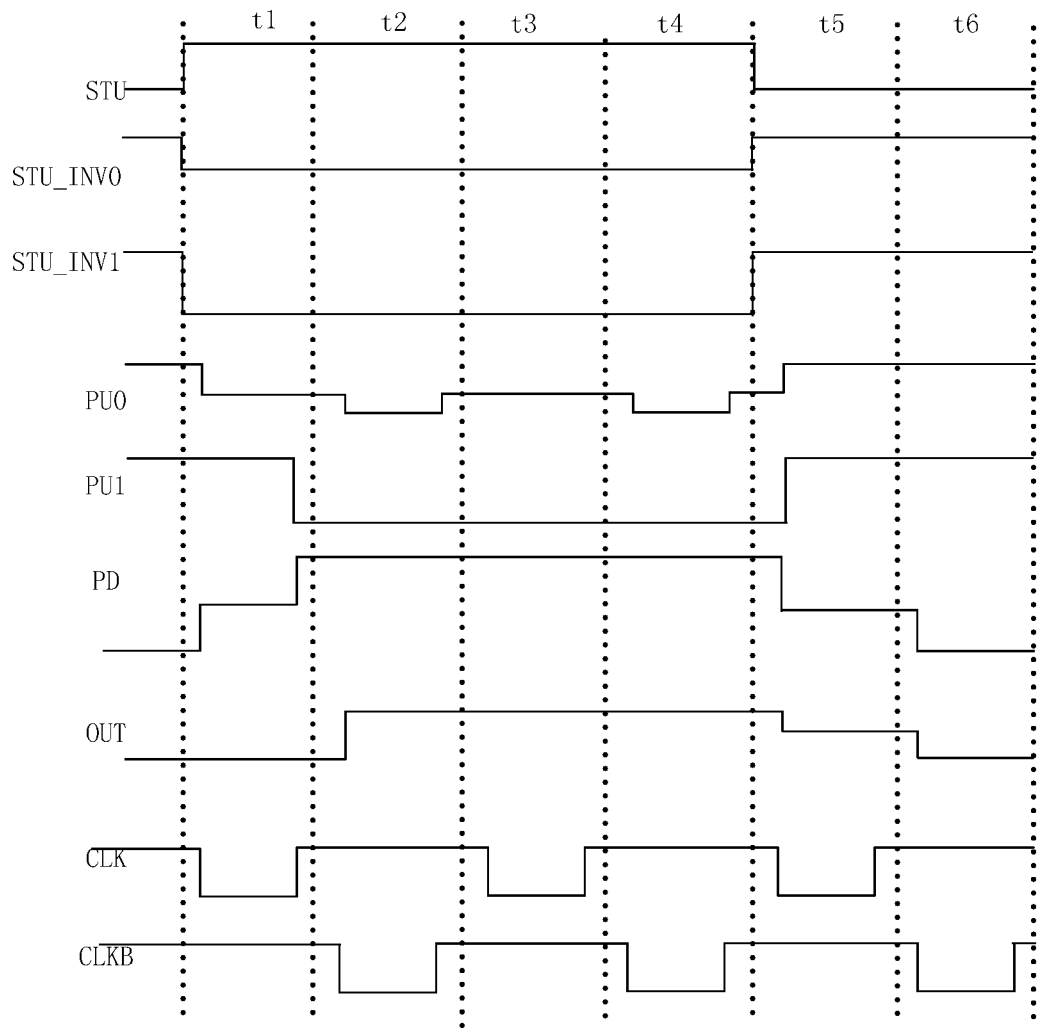
FIG. 6 is an operation timing diagram of a shift register unit according to an embodiment of the present disclosure.

FIG. 6 is an operation timing diagram of a shift register unit according to an embodiment of the present disclosure. As shown in FIG. 6, the operation timing diagram is suitable for the embodiment of the shift register unit shown in FIG. 5A.

In a first phase t1, CLK is at a low level, CLKB is at a high level, and STU is at a high level. The low level of CLK causes M1 to be turned on, and the high level at STU is transmitted to PD so that M12 is turned off and M10 is turned off. The high level at STU further causes M3, M5 and M7 to be turned off, and the low level at VGL causes M4 to be turned on. A potential at STU_INV0 is at a first low level, so that M6 is turned on. A potential at STU_INV1 is at a second low level, wherein an absolute value of the second low level is greater than that of the first low level. The low level of CLK further causes M8 to be turned on, and the second low level at STU_INV1 is transmitted to PU0 to cause M9 to be turned on, and the high level of CLKB is transmitted to the node SU. The high level of CLKB further causes M11 to be turned off. Since both M10 and M11 are turned off, a potential at PU1 is maintained at a previous high level, so that M13 is also maintained to be in a turn-off state. Since both M12 and M13 are turned off, a potential of a light emitting control signal output at OUT is maintained at a previous low level.

In a second phase t2, CLK is at a high level, CLKB is at a low level, and STU is at a high level. The high level of CLK causes M1 to be turned off, and the potential at PD is maintained at a high level, so that M12 is turned off, and M10 is turned off. The high level at STU causes both M3 and M5 to be turned off. The potential at STU_INV0 is maintained at a first low level, and the potential at STU_INTV1 is maintained at a second low level. The high level of CLK causes M8 to be turned off, and the high level at STU causes M7 to be turned off, and thereby a potential at PU0 is maintained at a low level, so that M9 is maintained to be in a turn-on state. The potential at the node SU becomes low since CLKB jumps from a high level to a low level, and due to the bootstrap action of C2, the potential at PU0 becomes a lower level. The low level of CLKB causes M11 to be turned on, and the low level at the node SU is transmitted to PU1, so that M13 is turned on, and the light emitting control signal output at OUT is at a high level.

In a third phase t3, CLK is at a low level, CLKB is at a high level, and STU is at a high level. Similarly to the first phase t1, M1 is turned on, the potential at PD is maintained at a high level, M12 is turned off, M10 is turned off, M3 is turned off, and M4 is turned on. The potential at STU_INV0 is at a first low level, M5 is turned off, and M6 is turned on. The potential at STU_INTV1 is at a second low level, wherein an absolute value of the second low level is greater than that of the first low level. M7 is turned off, M8 is turned on, the potential at PU0 is at a low level, and M9 is turned on, so that the potential at the node SU is pulled up. M11 is turned off, M10 is turned off, the potential at PU1 is maintained at a low level, and the potential of the light emitting control signal output at OUT is maintained at a high level.

In a fourth phase t4, CLK is at a high level, CLKB is at a low level, and STU is at a high level. Similarly to the second phase t2, M1 is turned off, the potential at PD is maintained at a high level, M12 is turned off, and M10 is turned off. M3 and M5 are both turned off, then the potential at STU_INV0 is maintained at a first low level, and the potential at STU_INV1 is maintained at a second low level. M8 is turned off, the potential at PU0 is maintained at a low level, and M9 is turned on. The potential at the node SU becomes low since CLKB jumps from a high level to a low level, and thereby due to the action of C2, the potential at PU0 becomes a lower level. M11 is turned on, the potential at PU1 is at a low level, and M13 is turned on, so that the light emitting control signal output at OUT is at a high level.

In a fifth phase t5, CLK is at a low level, CLKB is at a high level, and STU is at a low level. The low level of CLK causes M1 to be turned on, the low level at STU causes M3, M4, M5 and M7 to be turned on, and the low level at VGL causes M4 to be turned on. Turn-on of M3 causes the potential at STU_INV0 to be pulled up to the high level at VGH, so that M6 is turned off. Turn-on of M5 causes the potential at STU_INV1 to be also pulled up to the high level at VGH. The low level of CLK further causes M8 to be turned on, so that the potential at PU0 is pulled up to the high level at STU_INV1, and M9 is turned off. Since M1 is turned on, the potential at PD is pulled down, but since M2 is also turned on at this time, the high level of CLKB is transmitted to the node SD, and therefore the potential at PD may not be pulled down to VGL until CLKB inputs a low level in a next sixth phase t6. The potential at PD causes M10 to pull up the potential at PU1 to a level close to VGH. The potential at PD further causes M12 not to be completely turned on, and the potential at the light emitting control signal output at OUT may not be immediately converted into VGL, but is a level between VGH and VGL.

In the sixth phase t6, CLK is at a high level, CLKB is at a low level, and STU is at a low level. The high level of CLK causes M1 to be turned off, and the low level at STU is transmitted to PD, so that M2 is turned on. The low level of CLKB is transmitted to the node SD through M2 which is turned on, so that C1 is charged. The potential at PD is pulled down due to the bootstrap of C1, so that the potential at PD is lower than VGL to enable both M10 and M12 to be fully turned on. The full turn-on of M12 causes the potential of the light emitting control signal output at OUT to be at the low level at VGL. The full turn-on of M10 causes the potential at PU1 to be at the high level at VGH, to enable M13 to be turned off.

In some embodiments, the shift register unit shown in FIG. 5B has a similar operation timing. For example, in the shift register unit in FIG. 5B, the gate of M4 is connected to CLK, and since CLK inputs a low level in each of the first phase t1, the third phase t3 and the fifth phase t5, M4 may also be turned on.

In this specific embodiment of the shift register unit according to the present disclosure, two stages of inverters are used, which may achieve a larger output voltage range than a case of one stage of inverter (which may not achieve full-scale output) in a condition that a threshold voltage of the transistors in the shift register unit changes, so as to realize a better inversion effect. In the specific embodiment of the shift register unit according to the present disclosure, two stages of inverters are used, so that the shift register unit is less affected by parameters of the transistors during inversion or switching of an internal signal, and the coupling capacitor is eliminated to improve the stability of the circuit, so that a waveform of an output signal has a smaller jitter, which enhances the reliability of the circuit.

Figure 7A:
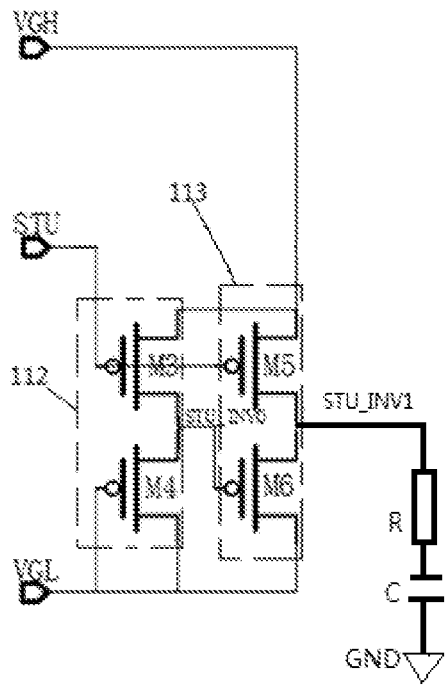
FIG. 7A is an exemplary circuit diagram of two stages of inverters in a shift register unit according to an embodiment of the present disclosure.

FIG. 7A is an exemplary circuit diagram of two stages of inverters in a shift register unit according to an embodiment of the present disclosure. As shown in FIG. 7, the two stages of inverters comprise a first stage of inversion control circuit 112 and a second stage of inversion control circuit 113.

The first stage of inversion control circuit 112 comprises: a first inversion control transistor M3 and a second inversion control transistor M4. The first inversion control transistor M3 has a gate connected to the input terminal STU, a source electrically connected to the high voltage input terminal VGH, and a drain connected to the first inversion node STU_INV0. The second inversion control transistor M4 has a gate electrically connected to the low voltage input terminal VGL, a source connected to the first inversion node STU_INV0, and a drain electrically connected to the low voltage input terminal VGL. The low voltage input terminal VGL is configured to input a low voltage, and the high voltage input terminal VGH is configured to input a high voltage.

The second stage of inversion control circuit 113 comprises: a third inversion control transistor M5 and a fourth inversion control transistor M6. The third inversion control transistor M5 has a gate connected to the input terminal STU, a source electrically connected to the high voltage input terminal VGH, and a drain connected to the second inversion node STU_INTV1. The fourth inversion control transistor M6 has a gate connected to the first inversion node STU_INV0, a source connected to the second inversion node STU_INV1, and a drain electrically connected to the low voltage input terminal VGL.

In FIG. 7A, the transistors M3, M4, M5, and M6 are all PMOS transistors, but the present disclosure is not limited thereto.

In FIG. 7A, a reference sign R refers to a load resistor, a reference sign C refers to a load capacitor, and a reference sign GND refers to a ground terminal.

Figure 7B:
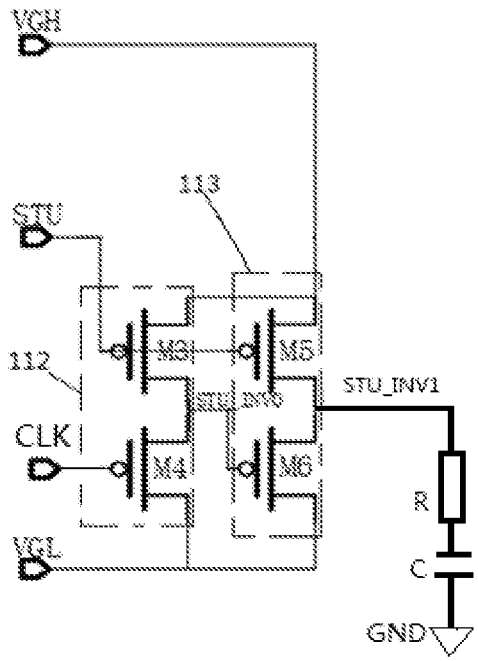
FIG. 7B is another exemplary circuit diagram of two stages of inverters in a shift register unit according to another embodiment of the present disclosure.

FIG. 7B is another exemplary circuit diagram of two stages of inverters in a shift register unit according to an embodiment of the present disclosure, wherein the two stages of inverters comprise a first stage of inversion control circuit 112 and a second stage of inversion control circuit 113.

The first stage of inversion control circuit 112 comprises: a first inversion control transistor M3 and a second inversion control transistor M4. The first inversion control transistor M3 has a gate connected to the input terminal STU, a source electrically connected to the high voltage input terminal VGH, and a drain connected to the first inversion node STU_INV0. The second inversion control transistor M4 has a gate connected to the first clock signal input terminal CLK, a source connected to the first inversion node STU_INV0, and a drain electrically connected to the low voltage input terminal VGL. The low voltage input terminal VGL is configured to input a low voltage, and the high voltage input terminal VGH is configured to input a high voltage.

The second stage of inversion control circuit 113 comprises: a third inversion control transistor M5 and a fourth inversion control transistor M6. The third inversion control transistor M5 has a gate connected to the input terminal STU, a source electrically connected to the high voltage input terminal VGH, and a drain connected to the second inversion node STU_INV1. The fourth inversion control transistor M6 has a gate connected to the first inversion node STU_INV0, a source connected to the second inversion node STU_INV1, and a drain electrically connected to the low voltage input terminal VGL.

In FIG. 7B, the transistors M3, M4, M5, and M6 are all PMOS transistors, but the present disclosure is not limited thereto.

In FIG. 7B, a reference sign R refers to a load resistor, a reference sign C refers to a load capacitor, and a reference sign GND refers to a ground terminal.

The embodiment of the two stages of inverters shown in FIG. 7B differs from the embodiment of the two stages of inverters shown in FIG. 7A in that, in FIG. 7B, the gate of M4 is connected to the first clock signal input terminal CLK, while in FIG. 7A, the gate of M4 is electrically connected to the low voltage input terminal VGL.

Figure 8:
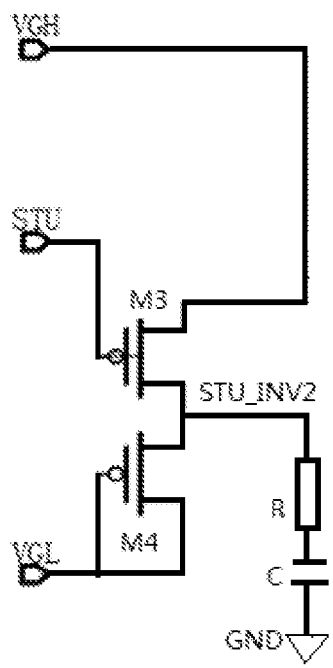
FIG. 8 is a circuit diagram of a single stage of inverter in a shift register unit in the related art.

FIG. 8 is a circuit diagram of a single stage of inverter in the related art. As shown in FIG. 8, the single stage of inverter comprises: transistors M3 and M4.

The transistor M3 has a gate connected to the input terminal STU, a source electrically connected to the high voltage input terminal VGH, and a drain connected to the inversion node STU_INV2.

The transistor M4 has a gate electrically connected to the low voltage input terminal VGL, a source connected to the inversion node STU_INV2, and a drain electrically connected to the low voltage input terminal VGL, wherein the low voltage input terminal VGL is configured to input a low voltage, and the high voltage input terminal VGH is configured to input a high voltage.

In FIG. 8, the transistors M3, M4, M5, and M6 are all PMOS transistors, but the present disclosure is not limited thereto.

In FIG. 8, a reference sign R refers to a load resistor, a reference sign C refers to a load capacitor, and a reference sign GND refers to a ground terminal.

In the related art shown in FIG. 8, the gate and the second electrode of the P-type transistor M4 are both connected to the low voltage input terminal VLG, so that the transistor P4 is always in a turn-on state. In ideal conditions, when the input signal at the input terminal STU is at a high level, the transistor M3 is turned off, and the transistor M4 which is turned on transmits the low level at the low voltage input terminal VGL to the inversion node STU_INV2; and when the input signal at the input terminal STU is at a low level, the transistor M3 is turned on, and thereby transmits the high level at the high voltage input terminal VGH to the inversion node STU_INV2. In this way, the inversion of the input signal is achieved. However, in a practical condition, due to a threshold voltage of the transistor M4, a low level value at the inversion node STU_INV2 is higher than a low level value (for example, V2) at the low voltage input terminal VGL when the inversion node STU_INV2 is at a low level. For an n-type transistor, for similar reasons, the inversion node STU_INV2 is unable to reach the high level (for example, V1) at the high voltage input terminal VGH. This causes the output voltage range at the inversion node STU_INV2 to be actually less than the full voltage range (i.e., falling within a voltage range from V2 to V1, which cannot be reached by the conventional approach). In addition, since level jump of the inversion node STU_INV2 is controlled only by the level at the input terminal STU, it takes a long time for the inversion node STU_INV2 to switch from a low level to a high level.

In contrast, as shown in FIGS. 7A and 7B, in the embodiment of the present disclosure, multiple stages of inversion control circuits are used, and although the potential at the first inversion node STU_INV0 cannot reach the full voltage range, the potential at the first inversion node STU_INV0 may be used to control output of a next stage of inversion control circuit, so that two transistors M3 and M4 of the next stage of inversion control circuit are alternately turned on and off, thereby avoiding the above problems caused by the transistor M4 being always turned on. For example, by taking FIG. 7A as an example, when the input terminal STU is at a high level, the first inversion node STU_INV0 is at a first low level, which is higher than a level at the low voltage input terminal VGL, but may cause the transistor M6 to be turned on. The high level at the input terminal STU causes the transistor M5 to be turned off, and thereby the transistor M6 causes the second inversion node STU_INTV1 to be closer to the level at the low voltage input terminal VGL than the first inversion node STU_INV0, and may even be equal to the level at VGL. When the input terminal STU is at a low level, the transistor M5 is turned on, the first inversion node STU_INV0 is at a high level, and the transistor M6 is turned off, so that the second inversion node STU_INV1 is close to or even equal to a high level at the high voltage input terminal VGH. In this way, the second inversion node STU_INV1 has a larger voltage range and a stable signal level at the second inversion node STU_INV1.

Figure 9:
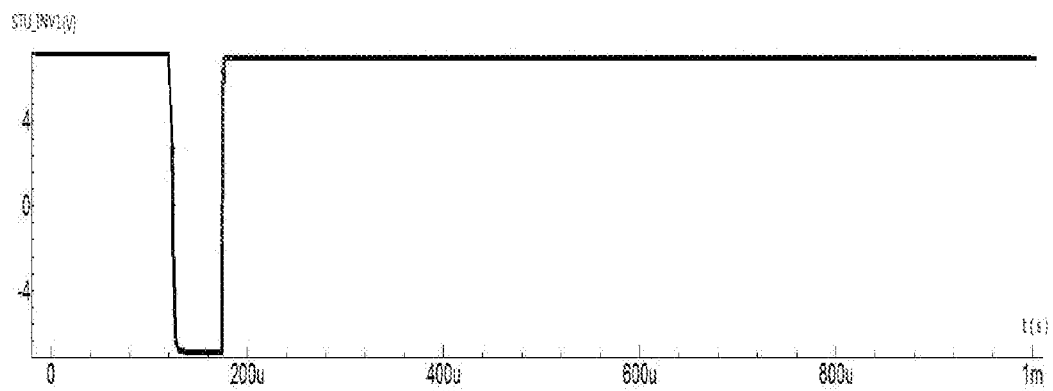
FIG. 9 is a simulation diagram of a potential at STU_INV1 in the two stages of inverters according to the embodiment shown in FIG. 7A when a threshold voltage of a Positive channel Metal Oxide Semiconductor (PMOS) transistor has a negative offset of 2V.

FIG. 9 is a simulation diagram of a potential at STU_INV1 in the two stages of inverters according to the embodiment shown in FIG. 7A when a threshold voltage of a PMOS transistor has a negative offset of 2V.

Figure 10:
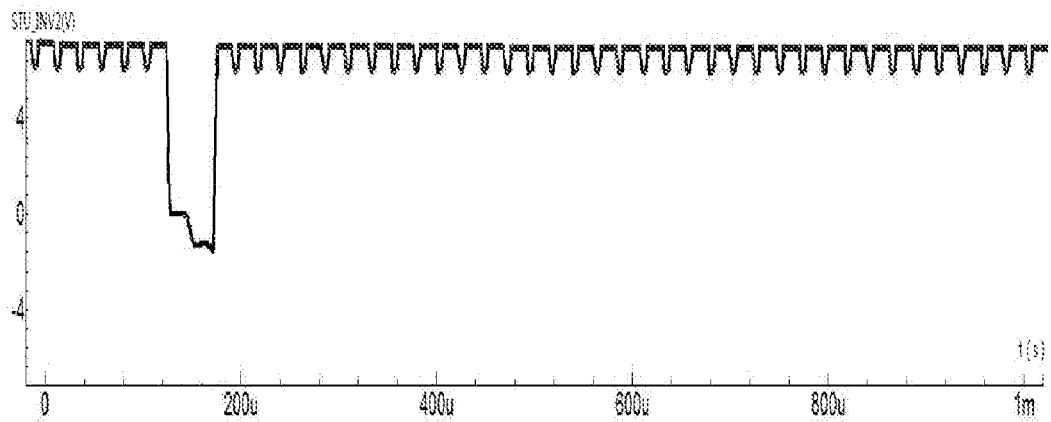
FIG. 10 is a simulation diagram of a potential at STU_INV2 in the single stage of inverter according to the embodiment shown in FIG. 8 when a threshold voltage of a PMOS transistor has a negative offset of 2V.

FIG. 10 is a simulation diagram of a potential at STU_INV2 in the single stage of inverter according to the embodiment shown in FIG. 8 when a threshold voltage of a PMOS transistor has a negative offset of 2V.

Figure 11:
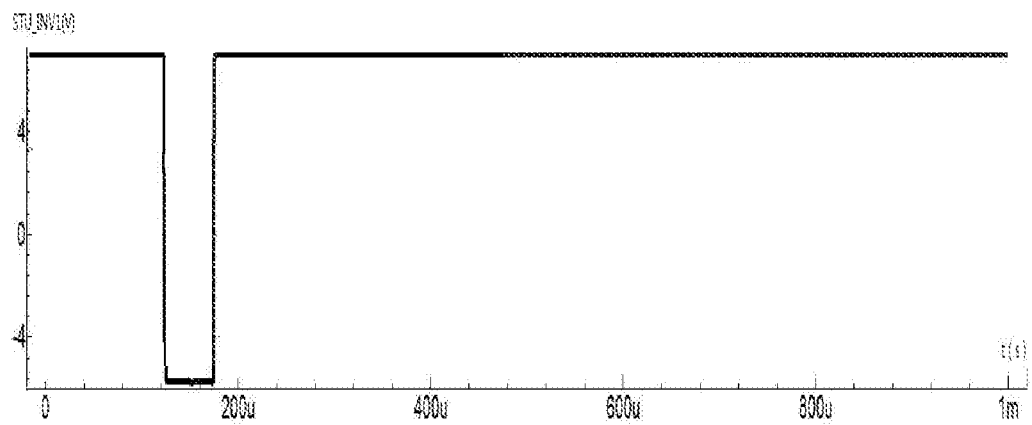
FIG. 11 is a simulation diagram of a potential at STU_INV1 in the two stages of inverters according to the embodiment shown in FIG. 7A when a threshold voltage of a PMOS transistor has a positive offset of 1.5V.

FIG. 11 is a simulation diagram of a potential at STU_INV1 in the two stages of inverters according to the embodiment shown in FIG. 7A when a threshold voltage of a PMOS transistor has a positive offset of 1.5V.

Figure 12:
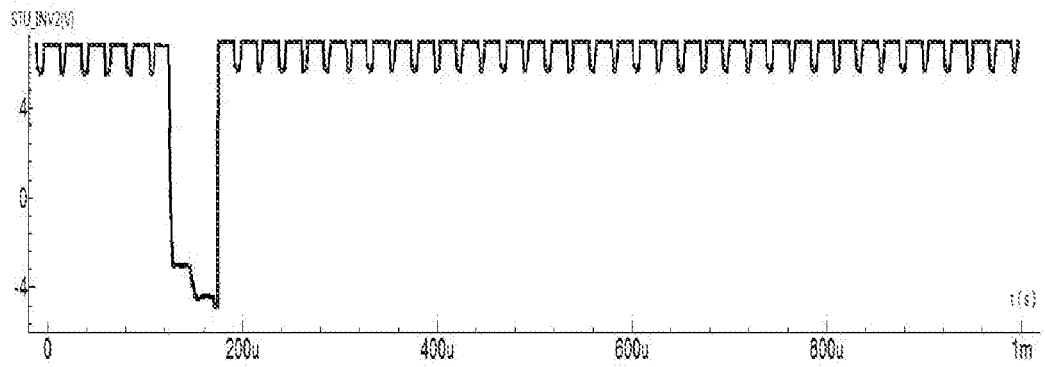
FIG. 12 is a simulation diagram of a potential at STU_INV2 in the single stage of inverter according to the embodiment shown in FIG. 8 when a threshold voltage of a PMOS transistor has a positive offset of 1.5V.

FIG. 12 is a simulation diagram of a potential at STU_INV2 in a case where the single stage of inverter according to the embodiment shown in FIG. 8 is connected in an actual shift register unit when a threshold voltage of a PMOS transistor has a positive offset of 1.5V.

Figure 13:
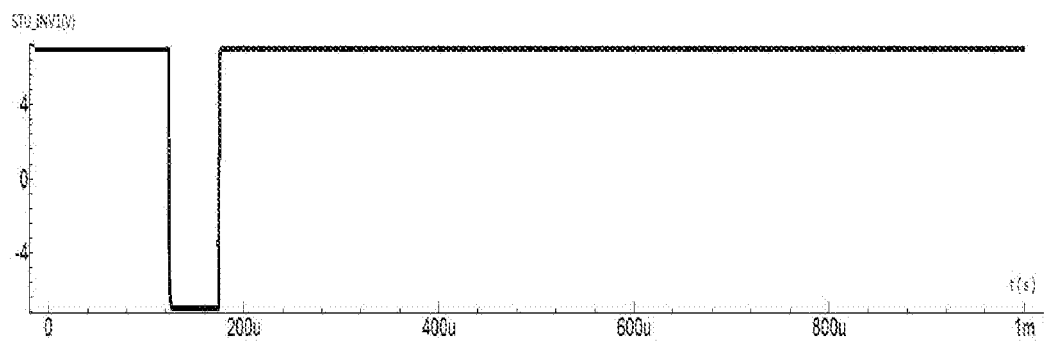
FIG. 13 is a simulation diagram of a potential at STU_INV1 in the two stages of inverters according to the embodiment shown in FIG. 7A when a threshold voltage of a PMOS transistor has no offset.

FIG. 13 is a simulation diagram of a potential at STU_INV1 in a case where the two stages of inverters according to the embodiment shown in FIG. 7A are connected in an actual shift register unit when a threshold voltage of a PMOS transistor has no offset.

Figure 14:
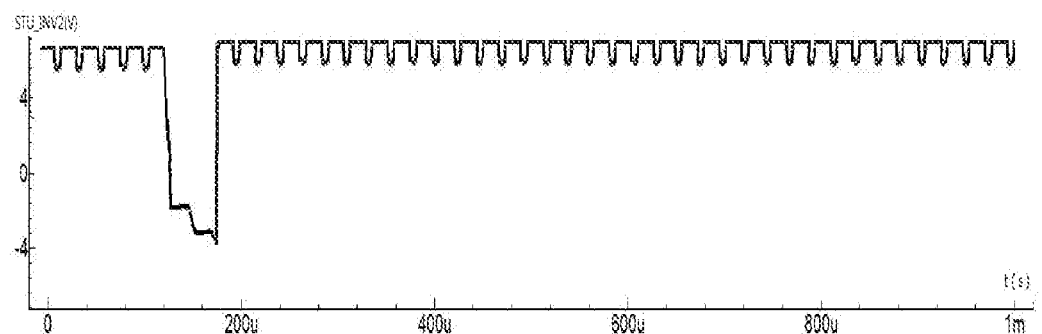
FIG. 14 is a simulation diagram of a potential at STU_INV2 in the single stage of inverter according to the embodiment shown in FIG. 8 when a threshold voltage of a PMOS transistor has no offset.

FIG. 14 is a simulation diagram of a potential at STU_INV2 in a case where the single stage of inverter according to the embodiment shown in FIG. 8 is connected in an actual shift register unit when a threshold voltage of a PMOS transistor has no offset.

In FIGS. 9 to 14, the horizontal axis is time t in units of s (seconds). In FIGS. 9, 11, and 13, the vertical axis is the potential at STU_INV1 in units of V (volts). In FIGS. 10, 12, and 14, the vertical axis is the potential at STU_INV2 in units of V (volts).

It may be seen by comparing FIG. 9 with FIG. 10, comparing FIG. 11 with FIG. 12, and comparing FIG. 13 with FIG. 14 that the potential at the inversion node STU_INV2 in the single stage of inverter in the related art has a certain jitter, and may not be output in a full scale. In contrast, the potential at the second inversion node STU_INV1 in the two stages of inverters according to the embodiment of the present disclosure has no jitter or substantially has no jitter, and may be output in a full scale.

Figure 15:
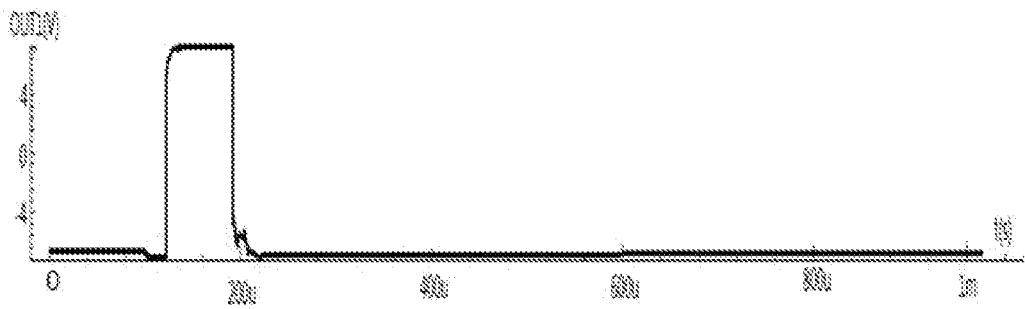
FIG. 15 is simulation waveform diagram of a light emitting control signal output at a light emitting control signal output terminal OUT1 of a first stage of shift register unit included in a light emitting control gate driving circuit according to an embodiment of the present disclosure when a threshold voltage of a PMOS transistor has a positive offset of 1V.

FIG. 15 is simulation waveform diagram of a light emitting control signal output at a light emitting control signal output terminal OUT1 of a first stage of shift register unit included in a light emitting control gate driving circuit according to an embodiment of the present disclosure when a threshold voltage of a PMOS transistor has a positive offset of 1V.

Figure 16:
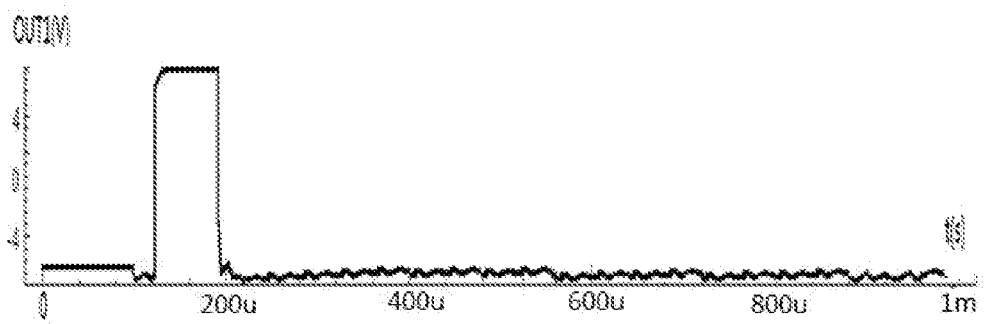
FIG. 16 is simulation waveform diagram of a light emitting control signal output at a light emitting control signal output terminal OUT1 of a first stage of shift register unit included in a light emitting control gate driving circuit according to an embodiment of the present disclosure when a threshold voltage of a PMOS transistor has a positive offset of 1.75V.

FIG. 16 is simulation waveform diagram of a light emitting control signal output at a light emitting control signal output terminal OUT1 of a first stage of shift register unit included in a light emitting control gate driving circuit according to an embodiment of the present disclosure when a threshold voltage of a PMOS transistor has a positive offset of 1.75V.

Figure 17:
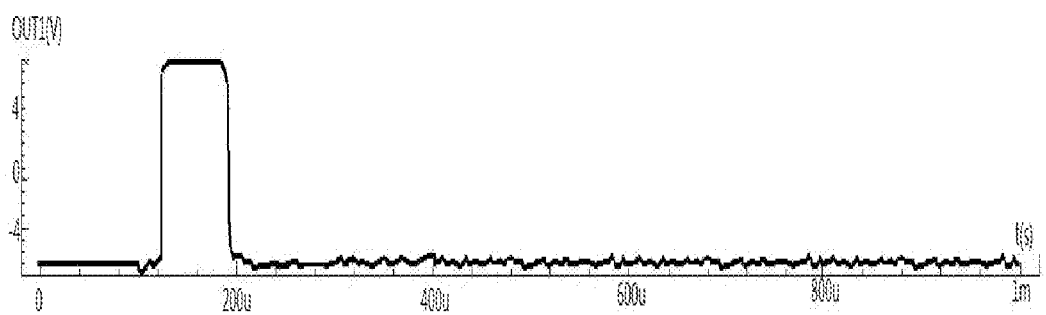
FIG. 17 is simulation waveform diagram of a light emitting control signal output at a light emitting control signal output terminal OUT1 of a first stage of shift register unit included in a light emitting control gate driving circuit according to an embodiment of the present disclosure when a threshold voltage of a PMOS transistor has a positive offset of 2V.

FIG. 17 is simulation waveform diagram of a light emitting control signal output at a light emitting control signal output terminal OUT1 of a first stage of shift register unit included in a light emitting control gate driving circuit according to an embodiment of the present disclosure when a threshold voltage of a PMOS transistor has a positive offset of 2V.

Figure 18:
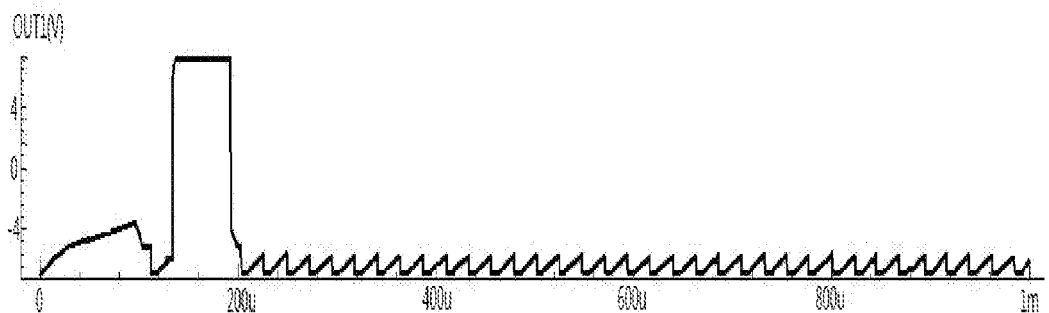
FIG. 18 is simulation waveform diagram of a light emitting control signal output at a light emitting control signal output terminal OUT1 of a first stage of shift register unit included in a light emitting control gate driving circuit in the related art when a threshold voltage of a PMOS transistor has a positive offset of 1V.

FIG. 18 is simulation waveform diagram of a light emitting control signal output at a light emitting control signal output terminal OUT1 of a first stage of shift register unit included in a light emitting control gate driving circuit in the related art when a threshold voltage of a PMOS transistor has a positive offset of 1V.

Figure 19:
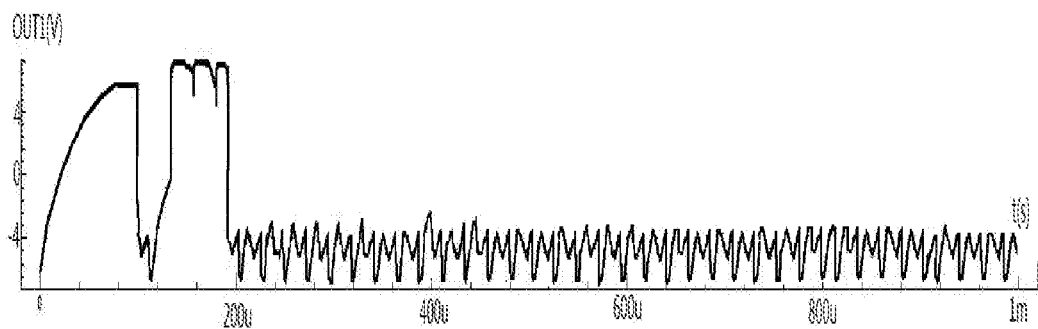
FIG. 19 is simulation waveform diagram of a light emitting control signal output at a light emitting control signal output terminal OUT1 of a first stage of shift register unit included in a light emitting control gate driving circuit in the related art when a threshold voltage of a PMOS transistor has a positive offset of 1.75V.

FIG. 19 is simulation waveform diagram of a light emitting control signal output at a light emitting control signal output terminal OUT1 of a first stage of shift register unit included in a light emitting control gate driving circuit in the related art when a threshold voltage of a PMOS transistor has a positive offset of 1.75V.

Figure 20:
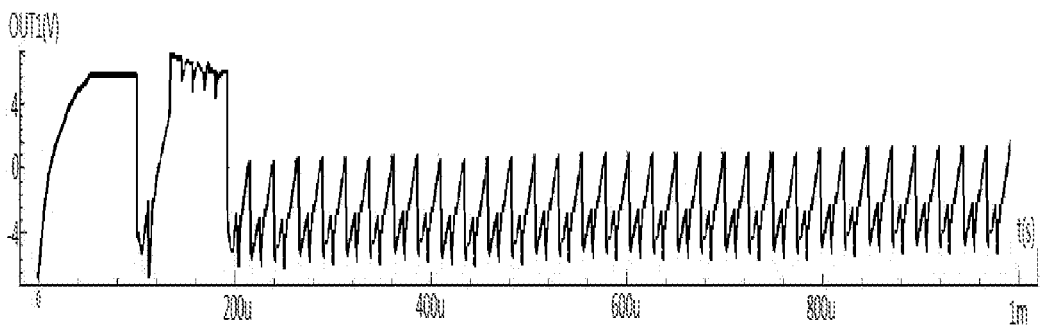
FIG. 20 is simulation waveform diagram of a light emitting control signal output at a light emitting control signal output terminal OUT1 of a first stage of shift register unit included in a light emitting control gate driving circuit in the related art when a threshold voltage of a PMOS transistor has a positive offset of 2V.

FIG. 20 is simulation waveform diagram of a light emitting control signal output at a light emitting control signal output terminal OUT1 of a first stage of shift register unit included in a light emitting control gate driving circuit in the related art when a threshold voltage of a PMOS transistor has a positive offset of 2V.

In FIGS. 15, 16, 17, 18, 19 and 20, the horizontal axis is time tin units of s (seconds).

By comparing FIG. 15 with FIG. 18, when the threshold voltage of the PMOS transistor has a positive drift of 1V, the light emitting control signal output at the light emitting control signal output terminal OUT1 of the first stage of shift register unit included in the light emitting control gate driving circuit according to the embodiment of the present disclosure has a smooth waveform and small noise, and the light emitting control signal output at the light emitting control signal output terminal OUT1 of the first stage of shift register unit included in the light emitting control gate driving circuit in the related art has large noise when the light emitting control signal is at a low level.

By comparing FIG. 16 with FIG. 19, when the threshold voltage of the PMOS transistor has a positive shift of 1.75V, the light emitting control signal output at the light emitting control signal output terminal OUT1 of the first stage of shift register unit included in the light emitting control gate driving circuit according to the embodiment of the present disclosure has a smooth waveform and small noise, and the light emitting control signal output at the light emitting control signal output terminal OUT1 of the first stage of shift register unit included in the light emitting control gate driving circuit in the related art has large noise in both a high level phase and a low level phase, which results in that a pixel circuit which receives the light emitting control signal may not be controlled to emit light properly.

By comparing FIG. 17 with FIG. 20, when the threshold voltage of the PMOS transistor has a positive shift of 2V, the light emitting control signal output at the light emitting control signal output terminal OUT1 of the first stage of shift register unit included in the light emitting control gate driving circuit according to the embodiment of the present disclosure has a smooth waveform and small noise, and the light emitting control signal output at the light emitting control signal output terminal OUT1 of the first stage of shift register unit included in the light emitting control gate driving circuit in the related art has large noise in both a high level phase and a low level phase, which results in that a pixel circuit which receives the light emitting control signal may not be controlled to emit light properly.

It may be seen from the comparison result of the above simulation waveform diagrams that in the embodiment of the present disclosure, when the threshold voltage of the PMOS transistor has a positive shift of 0V to 2V, the output light emitting control signal may have low noise, which meets the requirements of the light emitting control; while in the conventional technology, when the threshold voltage of the PMOS transistor has a positive shift value greater than or equal to 1V, large noise is generated, which results in that the light emitting control transistor in the pixel circuit may not be accurately controlled to be turned on and turned off.

Figure 21:
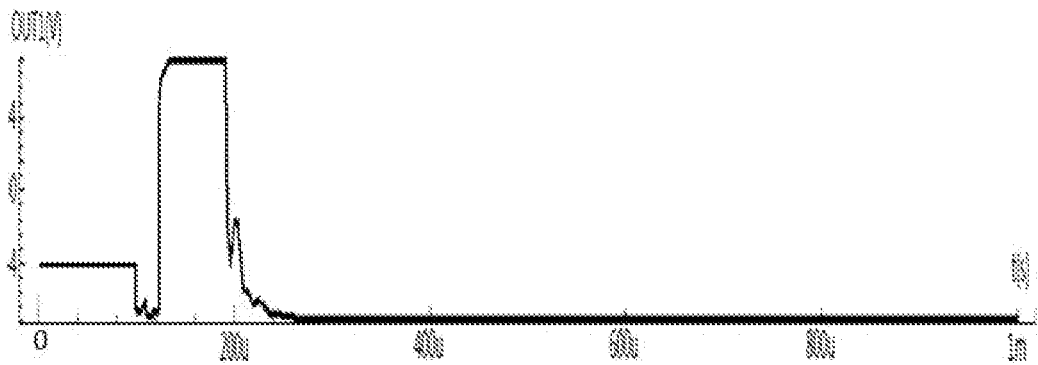
FIG. 21 is simulation waveform diagram of a light emitting control signal output at a light emitting control signal output terminal OUT1 of a first stage of shift register unit included in a light emitting control gate driving circuit according to an embodiment of the present disclosure when a threshold voltage of a PMOS transistor has a negative offset of 2V.

FIG. 21 is simulation waveform diagram of a light emitting control signal output at a light emitting control signal output terminal OUT1 of a first stage of shift register unit included in a light emitting control gate driving circuit according to an embodiment of the present disclosure when a threshold voltage of a PMOS transistor has a negative offset of 2V.

Figure 22:
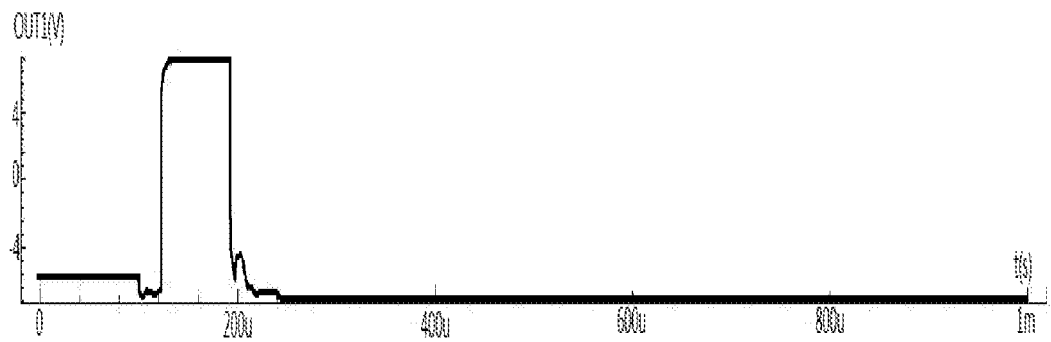
FIG. 22 is simulation waveform diagram of a light emitting control signal output at a light emitting control signal output terminal OUT1 of a first stage of shift register unit included in a light emitting control gate driving circuit according to an embodiment of the present disclosure when a threshold voltage of a PMOS transistor has no offset.

FIG. 22 is simulation waveform diagram of a light emitting control signal output at a light emitting control signal output terminal OUT1 of a first stage of shift register unit included in a light emitting control gate driving circuit according to an embodiment of the present disclosure when a threshold voltage of a PMOS transistor has no offset.

Figure 23:
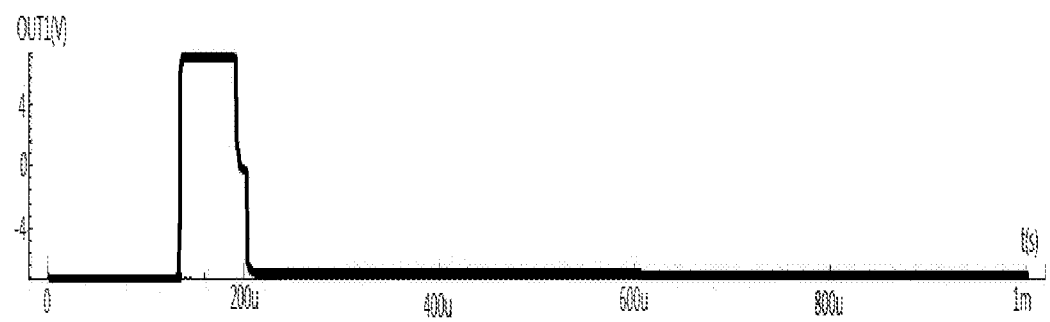
FIG. 23 is simulation waveform diagram of a light emitting control signal output at a light emitting control signal output terminal OUT1 of a first stage of shift register unit included in a light emitting control gate driving circuit in the related art when a threshold voltage of a PMOS transistor has a negative offset of 2V.

FIG. 23 is simulation waveform diagram of a light emitting control signal output at a light emitting control signal output terminal OUT1 of a first stage of shift register unit included in a light emitting control gate driving circuit in the related art when a threshold voltage of a PMOS transistor has a negative offset of 2V.

Figure 24:
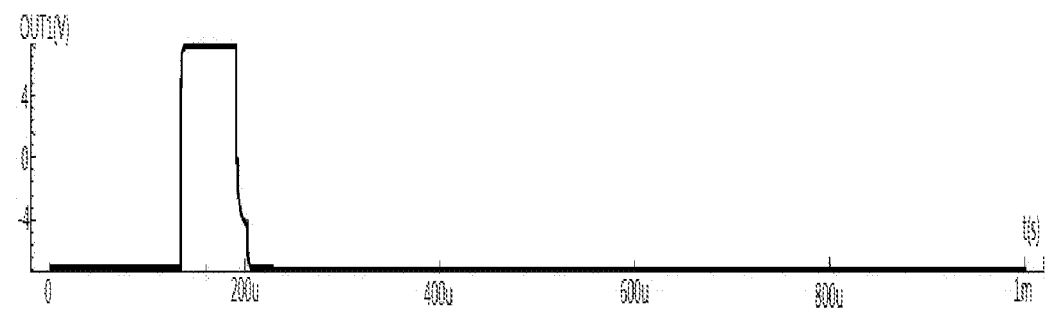
FIG. 24 is simulation waveform diagram of a light emitting control signal output at a light emitting control signal output terminal OUT1 of a first stage of shift register unit included in a light emitting control gate driving circuit in the related art when a threshold voltage of a PMOS transistor has no offset.

FIG. 24 is simulation waveform diagram of a light emitting control signal output at a light emitting control signal output terminal OUT1 of a first stage of shift register unit included in a light emitting control gate driving circuit in the related art when a threshold voltage of a PMOS transistor has no offset.

In FIGS. 21, 22, 23, and 24, the horizontal axis is time tin units of s (seconds).

It may be seen by comparing FIG. 21 with FIG. 23 and comparing FIG. 22 with FIG. 24 that when the threshold voltage of the PMOS transistor has a negative offset or has no offset, the light emitting control signal output by the first stage of shift register unit included in the light emitting control gate driving circuit according to the embodiment of the present disclosure has the same performance as that of the light emitting control signal output by the first stage of shift register unit included in the light emitting control gate driving circuit in the related art, and in the embodiment of the present disclosure, under the premise of improving the performance when the threshold voltage of the PMOS transistor has a positive offset, the performance when the threshold voltage of the PMOS transistor has a negative offset or has no offset may be maintained.

Figure 25:
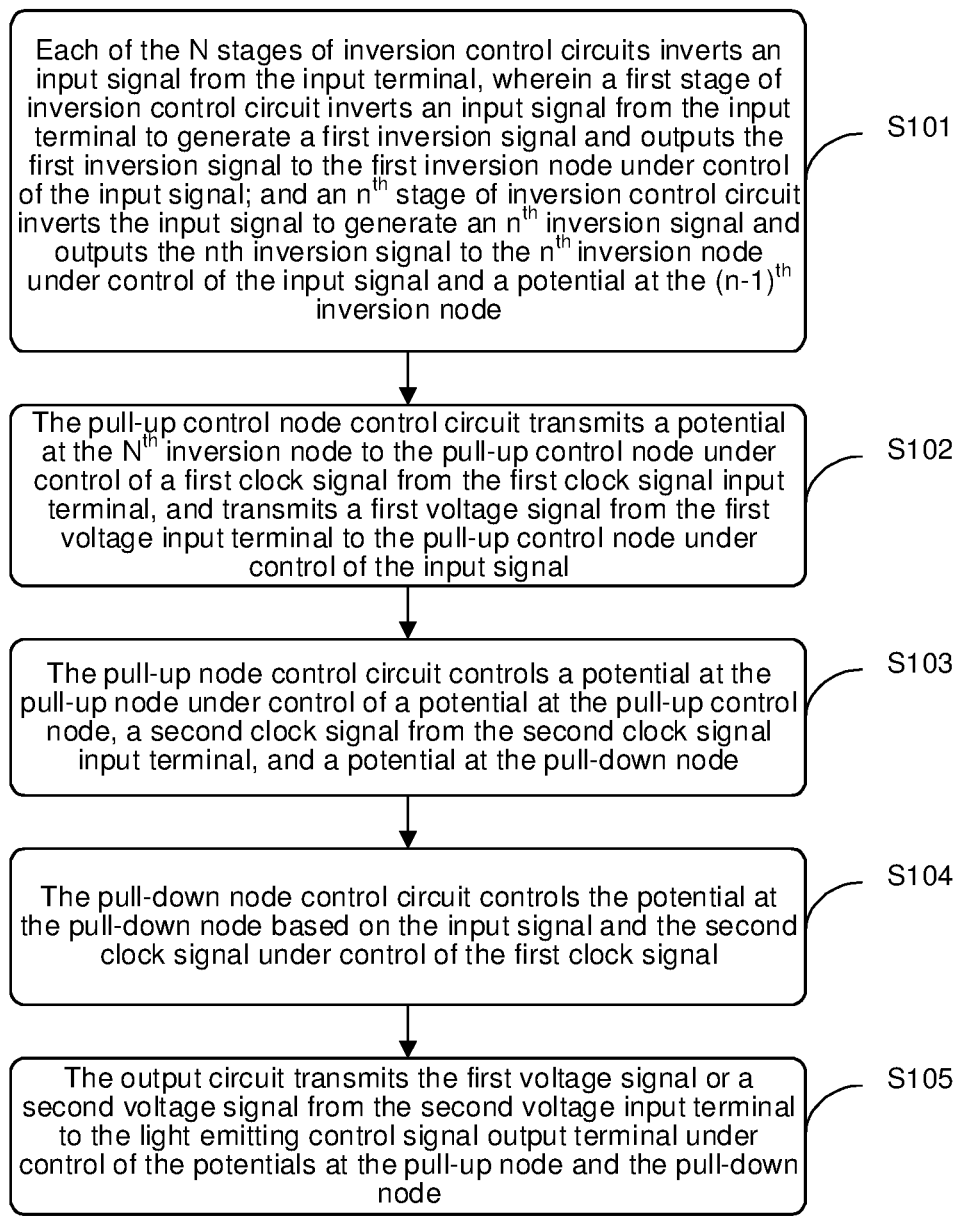
FIG. 25 illustrates a flowchart of a method for driving a shift register unit according to an embodiment of the present disclosure.

FIG. 25 illustrates a flowchart of a method for driving a shift register unit according to the embodiment of the present disclosure. The driving method may be applied to the shift register unit described above. The method for driving a shift register unit comprises the following steps.

In step S101, each of the N stages of inversion control circuits inverts an input signal from the input terminal, wherein a first stage of inversion control circuit inverts an input signal from the input terminal to generate a first inversion signal and outputs the first inversion signal to the first inversion node under control of the input signal; and an $n^{th}$ stage of inversion control circuit inverts the input signal to generate an $n^{th}$ inversion signal and outputs the $n^{th}$ inversion signal to the $n^{th}$ inversion node under control of the input signal and a potential at the $(n-1)^{th}$ inversion node, where n is an integer and $2 \leq n \leq N$, and N is an integer greater than 1.

In step S102, the pull-up control node control circuit transmits a potential at the $N^{th}$ inversion node to the pull-up control node under control of a first clock signal from the first clock signal input terminal, and transmits a first voltage signal from the first voltage input terminal to the pull-up control node under control of the input signal.

In step S103, the pull-up node control circuit controls a potential at the pull-up node under control of a potential at the pull-up control node, a second clock signal from the second clock signal input terminal, and a potential at the pull-down node.

In step S104, the pull-down node control circuit controls the potential at the pull-down node based on the input signal and the second clock signal under control of the first clock signal.

In step S105, the output circuit transmits the first voltage signal or a second voltage signal from the second voltage input terminal to the light emitting control signal output terminal under control of the potentials at the pull-up node and the pull-down node.

Although the method for driving a shift register circuit according to the embodiment of the present disclosure has been described above in a specific order, the embodiments of the present disclosure are not limited thereto, and the above steps may be performed in other orders as needed.

Figure 26:
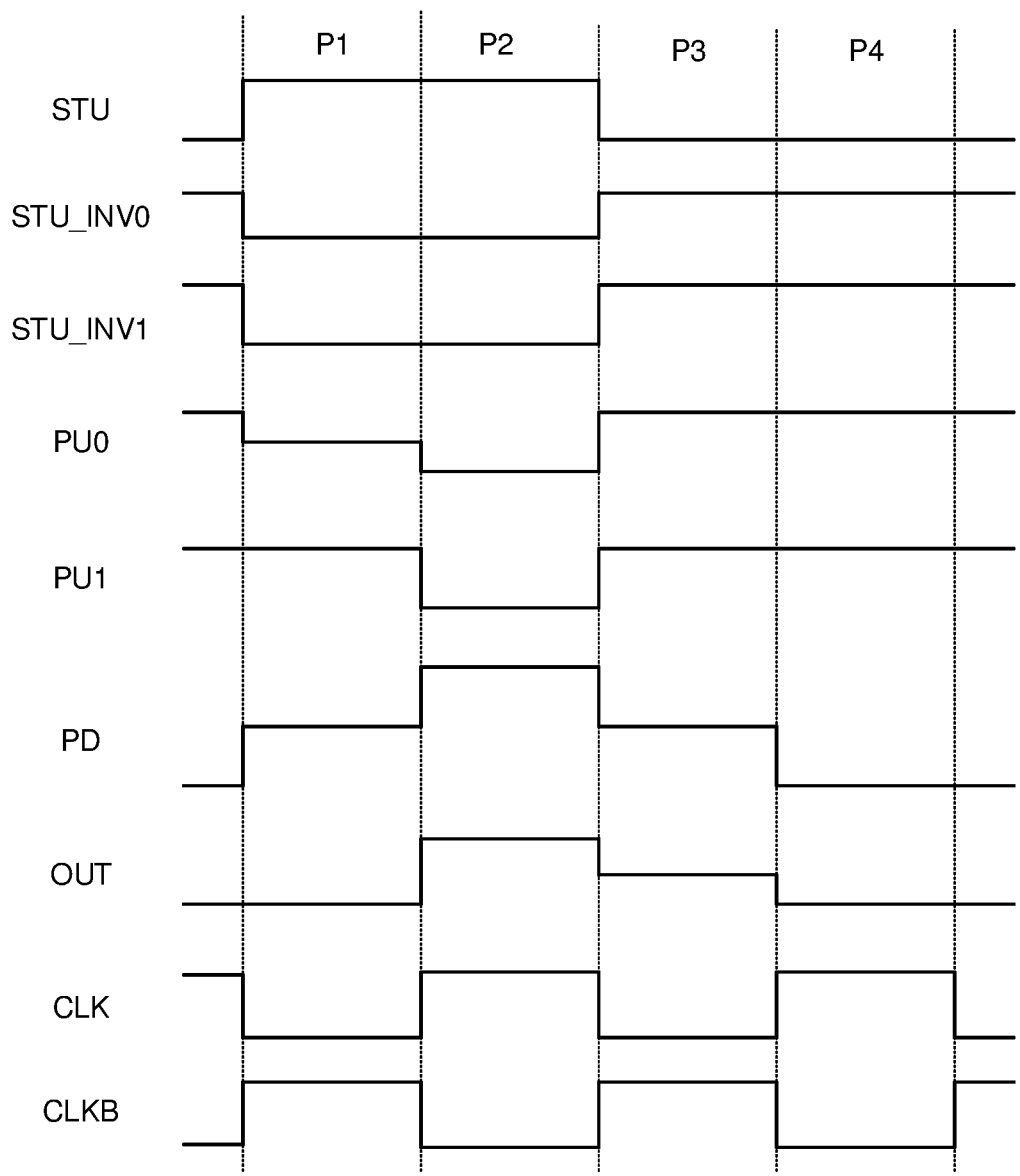
FIG. 26 illustrates a signal timing diagram of a method for driving a shift register unit according to an embodiment of the present disclosure.

FIG. 26 illustrates a signal timing diagram of a method for driving a shift register unit according to an embodiment of the present disclosure.

In a first period P1, a first clock signal at a low level, a second clock signal at a high level, and an input signal at a high level are provided, an $N^{th}$ inversion signal at a low level is output by an $N^{th}$ stage of inversion control circuit at an $N^{th}$ inversion node, a potential at the $N^{th}$ inversion node is transmitted by the pull-up control node control circuit to the pull-up control node, the pull-up node is maintained by the pull-up node control circuit to be at a high level, the pull-down node is caused by the pull-down node control circuit to be at a high level, and the light emitting control signal output terminal is maintained by the output circuit to be at a low level. For example, for the shift register shown in FIGS. 5A and 5B, the operation in the first period P1 may be implemented in a similar manner to that in the first phase T1.

In a second period P2, the first clock signal changes from a low level to a high level, the second clock signal changes from a high level to a low level, the $N^{th}$ stage of inversion control circuit maintains the $N^{th}$ inversion node to be at a low level, the pull-up control node control circuit maintains transmission of the potential at the $N^{th}$ inversion node to the pull-up control node, the pull-up node control circuit causes the pull-up node to become a low level, the pull-down node control circuit maintains the pull-down node to be at a low level, and the output circuit transmits a first voltage signal at a high level to the light emitting control signal output terminal. For example, for the shift register shown in FIGS. 5A and 5B, the operation in the second period P2 may be implemented in a similar manner to that in the second phase T2.

In a third period P3, the first clock signal changes from a high level to a low level, the second clock signal changes from a low level to a high level, the input signal changes from a high level to a low level, the $N^{th}$ stage of inversion control circuit outputs the $N^{th}$ inversion signal at a high level at the $N^{th}$ inversion node, the pull-up control node control circuit transmits the potential at the $N^{th}$ inversion node to the pull-up control node, and the pull-down node control circuit controls the potential at the pull-down node, which causes the output circuit to transmit, to the light emitting control signal output terminal, a level between a level of the first voltage signal and a level of the second voltage signal. For example, for the shift register shown in FIGS. 5A and 5B, the operation in the third period P3 may be implemented in a similar manner to that in the fifth phase T5.

In a fourth period P4, the first clock signal changes from a low level to a high level, the second clock signal changes from a high level to a low level, and the pull-down node control circuit causes the potential at the pull-down node to be lower than the level of the second voltage signal, wherein the potential at the pull-down node causes the output circuit to transmit the second voltage signal to the light emitting control signal output terminal. For example, for the shift register shown in FIGS. 5A and 5B, the operation in the fourth period P4 may be implemented in a similar manner to that in the sixth phase T6.

In the shift register unit according to the embodiment of the present disclosure, at least two stages of inversion control circuits are used to separate a function of controlling signal inversion from a function of pushing a next stage of circuit, which realizes a better output voltage range (also referred to as an output swing), and when process parameters change, the output swing is more close to a desired state (for example, a full-voltage range), and the circuit is less likely to fail. Compared with the conventional technology, the shift register unit according to the embodiment of the present disclosure has greater redundancy for a process of a PMOS transistor, particularly has a strong tolerance to a positive drift of a threshold voltage of the PMOS transistor. Further, in the shift register unit according to the embodiment of the present disclosure, no coupling capacitor is used, which avoids a resulting additional load on a clock trace.

Unlike the conventional technology in which a single stage of inverter is used, In the shift register unit according to the embodiment of the present disclosure, multiple stages of inverters (a number of stages of inversion units included in the multiple stages of inverters is greater than or equal to 2) are used, so that the shift register unit is less affected by parameters of transistors during inversion or switching of an internal signal, and the coupling capacitor is eliminated to improve the stability of the circuit, so that the shift register unit circuit has higher reliability.

According to a specific implementation, when the first level is a high level and the second level is a low level, a low potential at the first inversion node is greater than that at the $N^{th}$ inversion node.

According to another specific implementation, when the first level is a low level and the second level is a high level, the high potential at the first inversion node is less than that at the $N^{th}$ inversion node.

In some embodiments, the method for driving a shift register unit according to the present disclosure further comprises:

when the input signal is at the first level, the first clock signal is at the second level, and the second clock signal is at the first level, controlling, by the pull-down node control circuit, the potential at the pull-down node to be at the first level;

when the input signal is at the first level, the first clock signal is at the first level, and the second clock signal is at the second level, controlling, by the pull-down node control circuit, the potential at the pull-down node to be maintained at the first level;

when the input signal is at the second level, the first clock signal is at the second level, and the second clock signal is at the first level, controlling, by the pull-down node control circuit, the potential at the pull-down node to be at the second level; and when the input signal is at the second level, the first clock signal is at the first level, and the second clock signal is at the second level, controlling, by the pull-down node control circuit, the potential at the pull-down node to be at the second level.

Specifically, when the first level is a high level, the second level is a low level, and the pull-down node control circuit comprises the input control sub-circuit, the first energy storage sub-circuit, and the bootstrap control sub-circuit, and in a case where the input signal is at the second level, the first clock signal is at the first level, and the second clock signal is at the second level, the step of controlling by, the pull-down node control circuit, the potential at the pull-down node to be at the second level comprises:

turning off, by the input control sub-circuit, a connection between the input terminal and the pull-down node under control of the first clock signal input terminal; and turning on, by the bootstrap control sub-circuit, a connection between the second clock signal input terminal and the pull-down storage node to pull down the potential at the pull-down node through bootstrap under control of the pull-down node.

When the first level is a high level, the second level is a low level, and the pull-down node control circuit comprises the input control sub-circuit, the first energy storage sub-circuit, and the bootstrap control sub-circuit, the input control sub-circuit turns off the connection between the input terminal and the pull-down node under control of the first clock signal input terminal; and the bootstrap control sub-circuit turns on the connection between the second clock signal input terminal and the pull-down storage node to pull down the potential at the pull-down node through bootstrap under control of the pull-down node.

The light emitting control gate driving circuit according to the embodiment of the present disclosure comprises a plurality of cascaded shift register units, wherein except for a first stage of shift register unit, an input terminal of each stage of shift register unit is electrically connected to a light emitting control signal output terminal of a previous adjacent stage of shift register unit.

The display apparatus according to the embodiment of the present disclosure comprises the light emitting control gate driving circuit described above.

The display apparatus may be, for example, any product or component having a display function, such as an electronic paper, an OLED display apparatus, a mobile phone, a tablet computer, a television, a display, a notebook computer, a digital frame, a navigator, etc.

The above description is preferred embodiments of the present disclosure, and it should be illustrated that those of ordinary skill in the art may also make several improvements and refinements without departing from the principles of the present disclosure, and these improvements and refinements should also be considered to be within the protection scope of the present disclosure.

I claim:

1. A shift register comprising a pull-up control node control circuit, N stages of inversion control circuits, a pull-up node control circuit, a pull-down node control circuit, and an output circuit, where N is an integer greater than 1, wherein:

a first stage of inversion control circuit in the N stages of inversion control circuits is electrically connected to an input terminal and a first inversion node, and is configured to invert an input signal from the input terminal to generate a first inversion signal and output the first inversion signal to the first inversion node under control of the input signal;

an $n^{th}$ stage of inversion control circuit in the N stages of inversion control circuits is electrically connected to the input terminal, an $(n-1)^{th}$ inversion node, and an $n^{th}$ inversion node, and is configured to invert the input signal to generate an $n^{th}$ inversion signal and output the $n^{th}$ inversion signal to the $n^{th}$ inversion node under control of a potential at the $(n-1)^{th}$ inversion node, where n is an integer and $2 \leq n \leq N$;

the pull-up control node control circuit is electrically connected to the input terminal, a first clock signal input terminal, a first voltage input terminal, an $N^{th}$ inversion node, and a pull-up control node, and is configured to transmit a potential at the $N^{th}$ inversion node to the pull-up control node under control of a first clock signal from the first clock signal input terminal, and transmit a first voltage signal from the first voltage input terminal to the pull-up control node under control of the input signal;

the pull-up node control circuit is electrically connected to the pull-up control node, a second clock signal terminal, a pull-down node, and a pull-up node, and is configured to control a potential at the pull-up node under control of a potential at the pull-up control node, a second clock signal from the second clock signal input terminal and a potential at the pull-down node;

the pull-down node control circuit is electrically connected to the first clock signal input terminal, the second clock signal input terminal, the input terminal, and the pull-down node, and is configured to control the potential at the pull-down node based on the input signal and the second clock signal under control of the first clock signal; and the output circuit is electrically connected to a light emitting control signal output terminal, the pull-up node, the pull-down node, the first voltage input terminal and a second voltage input terminal, and is configured to transmit the first voltage signal to the light emitting control signal output terminal under control of the potential at the pull-up node and transmit a second voltage signal from the second voltage input terminal to the light emitting control signal output terminal under control of the potential at the pull-down node, wherein the pull-up node control circuit comprises:

a primary pull-up node control sub-circuit electrically connected to the pull-up control node, a pull-up storage node, and the second clock signal input terminal, and configured to transmit the second clock signal from the second clock signal input terminal to the pull-up storage node under control of the pull-up control node;

a second energy storage sub-circuit electrically connected to the pull-up control node and the pull-up storage node, and configured to store a voltage between the pull-up control node and the pull-up storage node; and a secondary pull-up node control sub-circuit electrically connected to the pull-down node, the first voltage input terminal, the pull-up node, the second clock signal input terminal, and the pull-up storage node, and configured to transmit the first voltage signal from the first voltage input terminal to the pull-up node under control of the pull-down node and transmit a potential at the pull-up storage node to the pull-up node under control of the second clock signal.

2. The shift register according to claim 1, wherein:
the primary pull-up node control sub-circuit comprises: a first pull-up node control transistor having a gate electrically connected to the pull-up control node, a first electrode electrically connected to the second clock signal input terminal, and a second electrode electrically connected to the pull-up storage node.

3. The shift register according to claim 1, wherein the first stage of inversion control circuit comprises:
a first inversion control transistor having a gate electrically connected to the input terminal, a first electrode electrically connected to the first voltage input terminal, and a second electrode electrically connected to the first inversion node; and
a second inversion control transistor having a gate electrically connected to the second voltage input terminal, a first electrode electrically connected to the first inversion node, and a second electrode electrically connected to the second voltage input terminal.

4. The shift register according to claim 1, wherein the pull-up control node control circuit comprises:
a first pull-up control node control transistor having a gate electrically connected to the first clock signal input terminal, a first electrode electrically connected to the pull-up control node, and a second electrode electrically connected to the $N^{th}$ inversion node; and
a second pull-up control node control transistor having a gate electrically connected to the input terminal, a first electrode electrically connected to the first voltage input terminal, and a second electrode electrically connected to the pull-up control node.

5. The shift register according to claim 1, wherein the output circuit comprises:
a first output transistor having a gate electrically connected to the pull-up node, a first electrode electrically connected to the light emitting control signal output terminal, and a second electrode electrically connected to the first voltage input terminal; and
a second output transistor having a gate electrically connected to the pull-down node, a first electrode electrically connected to the second voltage input terminal, and a second electrode electrically connected to the light emitting control signal output terminal.

6. The shift register according to claim 1, wherein:
the second energy storage sub-circuit comprises: a second capacitor having a first terminal electrically connected to the pull-up control node, and a second terminal electrically connected to the pull-up storage node.

7. The shift register according to claim 1, wherein the secondary pull-up node control sub-circuit comprises:
a second pull-up node control transistor having a gate electrically connected to the second clock signal input terminal, a first electrode electrically connected to the pull-up node, and a second electrode electrically connected to the pull-up storage node, and
a third pull-up node control transistor having a gate electrically connected to the pull-down node, a first electrode electrically connected to the first voltage input terminal, and a second electrode electrically connected to the pull-up node.

8. The shift register according to claim 1, wherein the first stage of inversion control circuit comprises:
a first inversion control transistor having a gate electrically connected to the input terminal, a first electrode electrically connected to the first voltage input terminal, and a second electrode electrically connected to the first inversion node; and
a second inversion control transistor having a gate electrically connected to the first clock signal input terminal, a first electrode electrically connected to the first inversion node, and a second electrode electrically connected to the second voltage input terminal.

9. The shift register according to claim 1, wherein the $n^{th}$ stage of inversion control circuit comprises:
a $(2n-1)^{th}$ inversion control transistor having a gate electrically connected to the input terminal, a first electrode electrically connected to the first voltage input terminal, and a second electrode electrically connected to the nth inversion node; and
a $(2n)^{th}$ inversion control transistor having a gate electrically connected to the $(n-1)^{th}$ inversion node, a first electrode electrically connected to the nth inversion node, and a second electrode electrically connected to the second voltage input terminal.

10. The shift register according to claim 1, wherein N=2, and wherein:
the first stage of inversion control circuit comprises:
a first inversion control transistor having a gate electrically connected to the input terminal, a first electrode electrically connected to the first voltage input terminal, and a second electrode electrically connected to the first inversion node; and
a second inversion control transistor having a gate electrically connected to the second voltage input terminal or the first clock signal input terminal, a first electrode electrically connected to the first inversion node, and a second electrode electrically connected to the second voltage input terminal; and
the second stage of inversion control circuit comprises:
a third inversion control transistor having a gate electrically connected to the input terminal, a first electrode electrically connected to the first voltage input terminal, and a second electrode electrically connected to the second inversion node; and
a fourth inversion control transistor having a gate electrically connected to the first inversion node, a first electrode electrically connected to the second inversion node, and a second electrode electrically connected to the second voltage input terminal.

11. A method for driving the shift register according to claim 1, comprising:
inverting, by the first stage of inversion control circuit of the N stages of inversion control circuits, an input signal from the input terminal, wherein the first stage of inversion control circuit inverts the input signal to generate a first inversion signal and outputs the first inversion signal to the first inversion node and the $n^{th}$ stage of inversion control circuit inverts the input signal to generate an $n^{th}$ inversion signal and outputs the $n^{th}$ inversion signal to the $n^{th}$ inversion node under control of the input signal and a potential at the $(n-1)^{th}$ inversion node, where n is an integer and $2 \leq n \leq N$, and N is an integer greater than 1;

transmitting, by the pull-up control node control circuit, a potential at the $N^{th}$ inversion node to the pull-up control node under control of a first clock signal from the first clock signal input terminal, and transmitting a first voltage signal from the first voltage input terminal to the pull-up control node under control of the input signal;

controlling, by the pull-up node control circuit, a potential at the pull-up node under control of a potential at the pull-up control node, a second clock signal from the second clock signal input terminal, and a potential at the pull-down node;

controlling, by the pull-down node control circuit, the potential at the pull-down node based on the input signal and the second clock signal under control of the first clock signal; and transmitting by the outputting circuit, the first voltage signal or a second voltage signal from the second voltage input terminal to the light emitting control signal output terminal under control of the potentials at the pull-up node and the pull-down node.

12. The method according to claim 11, wherein:

in a first period, a first clock signal at a low level, a second clock signal at a high level, and an input signal at a high level are provided, an Nth inversion signal at a low level is output by an $N^{th}$ stage of inversion control circuit at an Nth inversion node, a potential at the $N^{th}$ inversion node is transmitted by the pull-up control node control circuit to the pull-up control node, the pull-up node is maintained by the pull-up node control circuit to be at a high level, the pull-down node is caused by the pull-down node control circuit to be at a high level, and the light emitting control signal output terminal is maintained by the output circuit to be at a low level;

in a second period, the first clock signal changes from a low level to a high level, the second clock signal changes from a high level to a low level, the $N^{th}$ stage of inversion control circuit maintains the $N^{th}$ inversion node to be at a low level, the pull-up control node control circuit maintains transmission of the potential at the $N^{th}$ inversion node to the pull-up control node, the pull-up node control circuit causes the pull-up node to become a low level, the pull-down node control circuit maintains the pull-down node to be at a low level, and the output circuit transmits a first voltage signal at a high level to the light emitting control signal output terminal;

in a third period, the first clock signal changes from a high level to a low level, the second clock signal changes from a low level to a high level, the input signal changes from a high level to a low level, the $N^{th}$ stage of inversion control circuit outputs the Nth inversion signal at a high level at the $N^{th}$ inversion node, the pull-up control node control circuit transmits the potential at the $N^{th}$ inversion node to the pull-up control node, and the pull-down node control circuit controls the potential at the pull-down node, which causes the output circuit to transmit, to the light emitting control signal output terminal, a level between a level of the first voltage signal and a level of the second voltage signal; and in a fourth period, the first clock signal changes from a low level to a high level, the second clock signal changes from a high level to a low level, and the pull-down node control circuit causes the potential at the pull-down node to be lower than the level of the second voltage signal, wherein the potential at the pull-down node causes the output circuit to transmit the second voltage signal to the light emitting control signal output terminal.

13. A light emitting control gate driving circuit comprising a plurality of cascaded shift registers according to claim 1, wherein:

except for a first stage of shift register, an input terminal of each stage of shift register is electrically connected to a light emitting control signal output terminal of a previous stage of shift register.

14. A display apparatus, comprising the light emitting control gate driving circuit according to claim 13.

15. The shift register according to claim 1, wherein the pull-down node control circuit comprises:

an input control sub-circuit electrically connected to the first clock signal input terminal, the input terminal, and the pull-down node, and configured to transmit the input signal at the input terminal to the pull-down node under control of the first clock signal from the first clock signal input terminal;

a first energy storage sub-circuit electrically connected to the pull-down node and a pull-down storage node, and configured to store voltage between the pull-down node and the pull-down storage node; and a bootstrap control sub-circuit electrically connected to the second clock signal input terminal, the pull-down node, and the pull-down storage node, and configured to transmit the second clock signal at the second clock signal terminal to the pull-down storage node under control of the potential at the pull-down node.

16. The shift register according to claim 15, wherein:

the input control sub-circuit comprises: an input control transistor having a gate electrically connected to the first clock signal input terminal, a first electrode electrically connected to the input terminal, and a second electrode electrically connected to the pull-down node.

17. The shift register according to claim 15, wherein:

the first energy storage sub-circuit comprises: a first capacitor having a first terminal electrically connected to the pull-down node, and a second terminal electrically connected to the pull-down storage node.

18. The shift register according to claim 15, wherein:

the bootstrap control sub-circuit comprises: a bootstrap control transistor having a gate electrically connected to the pull-down node, a first electrode electrically connected to the second clock signal input terminal, and a second electrode electrically connected to the pull-down storage node.

* * * * *